United States Patent
Yano et al.

(10) Patent No.: US 10,494,004 B2
(45) Date of Patent: Dec. 3, 2019

(54) DEGRADATION ESTIMATION SYSTEM OF RAILROAD GROUND EQUIPMENT AND METHOD THEREOF

(71) Applicant: HITACHI, LTD., Tokyo (JP)

(72) Inventors: Kojin Yano, Tokyo (JP); Tomohito Takai, Tokyo (JP); Toshihiro Eguchi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 245 days.

(21) Appl. No.: 15/528,133

(22) PCT Filed: Oct. 16, 2015

(86) PCT No.: PCT/JP2015/079379
§ 371 (c)(1),
(2) Date: May 19, 2017

(87) PCT Pub. No.: WO2016/080125
PCT Pub. Date: May 26, 2016

(65) Prior Publication Data
US 2017/0305448 A1    Oct. 26, 2017

(30) Foreign Application Priority Data
Nov. 20, 2014    (JP) .................................. 2014-235125

(51) Int. Cl.
*G06G 7/48*    (2006.01)
*B61L 23/04*    (2006.01)
(Continued)

(52) U.S. Cl.
CPC ................. *B61L 23/04* (2013.01); *B61L 1/18* (2013.01); *B61L 27/0011* (2013.01);
(Continued)

(58) Field of Classification Search
CPC ....................................................... B61L 23/04
(Continued)

(56) References Cited

U.S. PATENT DOCUMENTS

2015/0074013 A1    3/2015    Schoonmaker et al.

FOREIGN PATENT DOCUMENTS

| GB | 2416900 A | 2/2006 |
|---|---|---|
| JP | 3645181 B2 | 5/2005 |

(Continued)

OTHER PUBLICATIONS

Extended European Search Report dated Jul. 26, 2018 for the European Patent Application No. 15861470.1, 9 pp.
(Continued)

*Primary Examiner* — Hugh M Jones
(74) *Attorney, Agent, or Firm* — Volpe and Koenig, P.C.

(57) ABSTRACT

A degradation estimation system includes a processing unit simulating an operation mode of equipment on a corresponding railroad section at each set-up timing based on corresponding railroad section timetable information, and processing respective simulation results, and an estimation unit aggregating respective processing results of the processing unit. The processing unit simulates a travel transition of each training existing in the corresponding railroad section timetable information as a dynamic of each train based on corresponding railroad section timetable information and a running curve, simulates a state change of each track circuit based on the simulation result and railroad track information, and simulates an operational change of the equipment on each track circuit. The estimation unit aggregates the simulation result of the processing unit indicating the operational change of the equipment disposed on each track circuit, and estimates the degradation of the equipment from the aggregation result.

14 Claims, 18 Drawing Sheets

(51) Int. Cl.
*B61L 1/18* (2006.01)
*B61L 27/00* (2006.01)
*G06F 17/50* (2006.01)
*B61L 25/02* (2006.01)
*B61L 25/04* (2006.01)
*B61L 29/08* (2006.01)
*G05B 13/02* (2006.01)
*G05B 13/04* (2006.01)

(52) U.S. Cl.
CPC ........ *G06F 17/5009* (2013.01); *B61L 25/021* (2013.01); *B61L 25/04* (2013.01); *B61L 29/08* (2013.01); *G05B 13/0265* (2013.01); *G05B 13/04* (2013.01)

(58) Field of Classification Search
USPC .......................................................... 703/6
See application file for complete search history.

(56) References Cited

FOREIGN PATENT DOCUMENTS

| | | |
|---|---|---|
| JP | 2007-302250 A | 11/2007 |
| JP | 4295082 B2 | 7/2009 |
| JP | 2012-076626 A | 4/2012 |
| JP | 2013-253847 A | 12/2013 |
| JP | 2014-091424 A | 5/2014 |
| JP | 2015-036260 A | 2/2015 |

OTHER PUBLICATIONS

Ohno, Hiroyuki, "Track State Monitoring System Using Railway Operating Vehicle," Journal of the Japan Society of Mechanical Engineers, 2009.3, vol. 112, No. 1084, 5 pgs.

International Search Report, PCT/JP2015/079379, dated Jan. 19, 2016, 2 pgs.

| RAILROAD SECTION ID | TRAIN NUMBER | TRAIN TYPE | STATION NAME | TRACK NUMBER | DEPARTURE/ ARRIVAL/ TRANSIT | TIME |
|---|---|---|---|---|---|---|
| L01 | T001 | RAPID TRAIN | A STATION | TRACK 2 | ARRIVAL | 16:00:00 |
| L01 | T001 | RAPID TRAIN | A STATION | TRACK 2 | DEPARTURE | 16:01:00 |
| L01 | T001 | RAPID TRAIN | B STATION | TRACK 1 | ARRIVAL | 16:10:00 |
| : | : | | : | : | : | : |
| L01 | T021 | LOCAL TRAIN | N STATION | TRACK 1 | ARRIVAL | 00:30:00 |

(b)

| TRAIN NUMBER | TRAIN MODEL |
|---|---|
| T001 | SS01 |
| T002 | SS05 |
| T003 | SS08 |
| : | : |
| Txxx | SS31 |

(c)

| TRAIN NUMBER | NUMBER OF CARS | TOTAL TRAIN LENGTH |
|---|---|---|
| T001 | 8 | 160m |
| T002 | 10 | 200m |
| T003 | 10 | 200m |
| : | : | : |
| Txxx | 8 | 160m |

FIG.4

| 401 | 402 | 403 | 404 | 405 | 406 | 407 | 408 | 409 |
|---|---|---|---|---|---|---|---|---|
| RAILROAD SECTION ID | START STATION | END STATION | START STATION TRANSIT/ STOP | END STATION TRANSIT/ STOP | DISTANCE (IN KILOMETERS) | SPEED | ADDITION-SUBTRACTION SPEED | ELAPSED TIME |
| L01 | A STATION | B STATION | STOP | TRANSIT | 0.00km | 10.0km/h | 1km/h/s | 00:00:00 |
| L01 | A STATION | B STATION | STOP | TRANSIT | 0.04km | 20.0km/h | 1km/h/s | 00:00:10 |
| L01 | A STATION | B STATION | STOP | TRANSIT | 0.11km | 30.0km/h | 1km/h/s | 00:00:20 |
| ... | ... | ... | ... | ... | ... | ... | ... | ... |

| 601 | 602 | 603 | 604 | 605 |
|---|---|---|---|---|
| RAILROAD SECTION ID | TRACK CIRCUIT ID | CONNECTING EQUIPMENT TYPE | CONNECTING EQUIPMENT ID | INSTALLATION DISTANCE (IN KILOMETERS) |
| L01 | K001 | SIGNAL | SG001 | 0.00km |
| L01 | K001 | CROSSING GATE | SD001 | 0.50km |
| L01 | K002 | SIGNAL | SG002 | 1.60km |
| ⋮ | ⋮ | ⋮ | ⋮ | ⋮ |

135

| 611 | 612 | 613 |
|---|---|---|
| CONNECTING EQUIPMENT ID | UPDATE FREQUENCY | INSTALLATION/ UPDATED DATE |
| SG001 | 0 | 2005/4/1 |
| SG001 | 1 | 2008/4/1 |
| SG001 | 2 | 2011/4/1 |
| ⋮ | ⋮ | ⋮ |
| SG002 | 0 | 2005/4/10 |
| ⋮ | ⋮ | ⋮ |

| CONNECTING DEVICE TYPE | ACQUISITION INFORMATION TYPE |
|---|---|
| SIGNAL | LIGHTING TIME, LIGHTING FREQUENCY |
| CROSSING GATE | CROSSING GATE OPERATION FREQUENCY |
| ⋮ | ⋮ |

FIG.14

| RAILROAD SECTION ID 1401 | TRAIN NUMBER 1402 | DATE 1403 | TIME 1404 | DISTANCE (IN KILOMETERS) 1405 | SPEED 1406 | ADDITION -SUBTRACTION SPEED 1407 | NOTCH INFORMATION 1408 |
|---|---|---|---|---|---|---|---|
| L01 | T001 | 20xx/01/05 | 16:00:30 | 0.00km | 10.0km/h | 1km/h/s | 2 |
| L01 | T001 | 20xx/01/05 | 16:00:40 | 0.04km | 20.0km/h | 1km/h/s | 2 |
| L01 | T001 | 20xx/01/05 | 16:00:50 | 0.11km | 30.0km/h | 1km/h/s | 3 |
| ‥ | ‥ | ‥ | ‥ | ‥ | ‥ | ‥ | ‥ |

120

| DEVICE TYPE | IMPACT EVALUATION |
|---|---|
| RAILS | ADDITION-SUBTRACTION SPEED |
| TROLLEY LINE | RUNNING SPEED |
| : | : |

FIG.17

| 1701 | 1702 | 1703 | 1704 | 1705 | 1706 | 1707 | 1708 | 1709 | 1710 |
|---|---|---|---|---|---|---|---|---|---|
| RAILROAD SECTION ID | TRAIN NUMBER | STATION NAME | TRACK NUMBER | DEPARTURE/ ARRIVAL/ TRANSIT | IMPLE- MENTATION DATE | IMPLE- MENTATION TIME | ON-RAIL SECTION | DISTANCE (IN KILOMETERS) | SPEED |
| L01 | T001 | A STATION | TRACK 2 | ARRIVAL | 20xx/01/05 | 16:00:30 | K101 | 0.00km | 10.0km/h |
| L01 | T001 | A STATION | TRACK 2 | ARRIVAL | 20xx/01/05 | 16:00:40 | K101 | 0.04km | 20.0km/h |
| L01 | T001 | A STATION | TRACK 2 | ARRIVAL | 20xx/01/05 | 16:00:50 | K102 | 0.11km | 30.0km/h |
| : | : | : | : | : | : | : | : | : | : |
| L01 | T021 | N STATION | TRACK 1 | ARRIVAL | 20xx/01/05 | 00:30:00 | 124.12km | 124.12km | 00.0km/h |

125

| RAILROAD SECTION ID | STATION NAME | DISTANCE (IN KILOMETERS) |
|---|---|---|
| L01 | A STATION | 0.00km |
| L01 | B STATION | 5.6km |
| L01 | C STATION | 8.8km |
| : | : | : |

DEGRADATION ESTIMATION SYSTEM OF RAILROAD GROUND EQUIPMENT AND METHOD THEREOF

TECHNICAL FIELD

The present invention relates to a maintenance system of railroad ground equipment, and in particular relates to a degradation estimation system of railroad ground equipment for estimating the degradation of railroad ground equipment, as well as to the method thereof.

BACKGROUND ART

An equipment maintenance system of railroad ground equipment is a system which supports the monitoring, inspection and replacement of ground equipment for enabling the smooth performance of railroad services. There are various types of railroad ground equipment, and signal-related equipment include, for instance, signals, points, alarms, and crossing gates, and railroad track-related equipment include, for instance, rails, ties and railroad switches, and power-related equipment include, for instance, feeder lines and trolley lines. Conventionally, a person was required to go to the site and conduct the inspection on site. However, in recent years, attempts are being made to reduce the manual inspection costs through remote monitoring using various sensors mounted on railroad vehicles. For example, PTL 1 describes a method which enables the remote determination of whether or not a point is normal or abnormal by taking the history of the operation condition of the point, separating sound operation data from unsound operation data, and estimating whether the current point operation data corresponds to sound operation data or unsound operation data. Moreover, NPTL 1 describes a system which enables the detection of an abnormality of the railroad track by mounting sensors on an operating vehicle.

CITATION LIST

Patent Literature

[PTL 1] Japanese Patent No. 4295082

Non-Patent Literature

[NPTL 1] Hiroyuki Ohno, Track State Monitoring System Using Railway Operating Vehicle, Journal of the Japan Society of Mechanical Engineers 2009. 3 Vol. 112 No. 1084 pp. 233

SUMMARY OF THE INVENTION

Problems to be Solved by the Invention

Nevertheless, with the foregoing conventional technologies, there is a problem in that certain ground equipment cannot be dealt with, and it is not possible to predict when a malfunction may occur. In other words, while PTL 1 describes a method which enables the remote determination of whether or not a point is normal or abnormal, PTL 1 is unable to offer a perspective on when the point will become abnormal. Furthermore, in cases where the point is determined to be abnormal, it is necessary to urgently send a maintenance worker to the site, and the maintenance of a support system and the storage of spare parts are required for taking emergency measures. So long as such emergency measures need to be taken, it is difficult to reduce maintenance costs. Moreover, while NPTL 1 is able to detect an abnormality of the railroad track, it is difficult to deal with other ground equipment with NPTL 1. For example, since crossing gates and points are operated before or after the operating vehicle is run, it is difficult to observe crossing gates and points from the operating vehicle. In order to prevent the occurrence of an abnormality in equipment and reduce the maintenance cost, it is necessary to perform preventive replacement in more ground equipment at a proper timing.

An object of the present invention is to provide a degradation estimation system of railroad ground equipment capable of estimating the degradation of equipment by simulating the operation mode of such equipment, as well as to provide a method thereof.

Means to Solve the Problems

In order to achieve the foregoing object, the present invention comprises a processing unit which simulates, based on corresponding railroad section timetable information for managing a timetable of a plurality of trains running on a corresponding railroad section to be simulated, an operation mode of equipment disposed on the corresponding railroad section, and an estimation unit which aggregates each processing result of the processing unit and estimates a degradation of the equipment from the aggregation result.

Advantageous Effects of the Invention

According to the present invention, it is possible to simulate the operation mode of equipment, and estimate the degradation of the equipment.

BRIEF DESCRIPTION OF DRAWINGS

FIG. 3 is a configuration diagram of peripheral railroad section timetable information.

FIG. 4 is a configuration diagram of a running curve.

FIG. 6 is a configuration diagram of equipment information.

FIG. 14 is a configuration diagram of train running information.

FIG. 17 is a configuration diagram of service history information.

DESCRIPTION OF EMBODIMENTS

Figure 1:
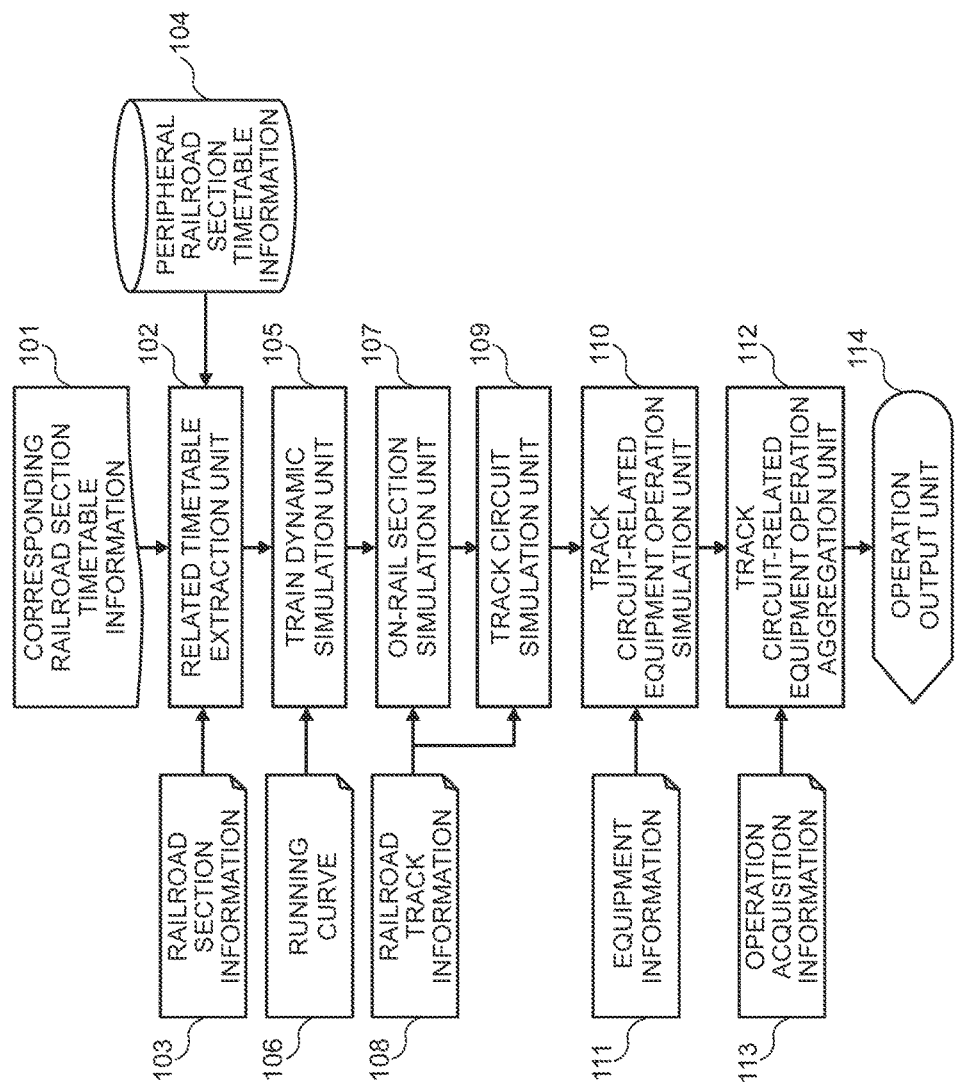
FIG. 1 is a configuration diagram showing the first embodiment of the degradation estimation system of railroad ground equipment according to the present invention.

Embodiments of the present invention are now explained with reference to the appended drawings. Components that are given the same reference numeral represent the same component, and let it be assumed that the basic configuration and operation thereof are the same.

First Embodiment

In this embodiment, an operation mode of track circuit-related equipment disposed on each track circuit of a corresponding railroad section is simulated based on corresponding railroad section timetable information for managing a timetable of a plurality of trains running on a corresponding railroad section, an operating quantity of each track circuit-related equipment is aggregated from the simulation result, and a degradation of each track circuit-related equipment is estimated from the aggregation result.

FIG. 1 is a configuration diagram showing the first embodiment of the degradation estimation system of railroad ground equipment according to the present invention. In FIG. 1, the degradation estimation system of railroad ground equipment is configured from a computer device comprising information processing resources such as a processor (CPU), an I/O interface, a storage device (for instance, a memory and an HDD), a display device (for instance, a liquid crystal display device) and a bus which mutually connects the foregoing components, and a terminal device which inputs various types of information, for example, corresponding railroad section timetable information 101 and peripheral railroad section timetable information 104, is connected to the I/O interface.

The processor functions as an execution unit which executes simulation processing according to a simulation program stored in the memory. The memory stores a processing unit which simulates an operation mode of equipment disposed on a corresponding railroad section at each set-up timing based on corresponding railroad section timetable information for managing a timetable of a plurality of trains running on the corresponding railroad section to be simulated, and processes the respective simulation results, and an estimation unit which aggregates the respective processing results of the processing unit, as well as one or more computer programs.

Specifically, the memory stores, as the processing unit, a related timetable extraction unit 102, a train dynamic simulation unit 105, an on-rail section simulation unit 107, a track circuit simulation unit 109, and a track circuit-related equipment operation simulation unit 110, and stores, as the estimation unit, a track circuit-related equipment operation aggregation unit 112 and an operation output unit 114. Here, as a result of the processor (CPU) executing the computer programs (for instance, simulation programs) stored in the memory, the related timetable extraction unit 102, the train dynamic simulation unit 105, the on-rail section simulation unit 107, the track circuit simulation unit 109, the track circuit-related equipment operation simulation unit 110, the track circuit-related equipment operation aggregation unit 112 and the operation output unit 114 are able to exhibit their respective functions (their function as a program).

The HDD (Hard Disk Drive) stores railroad section information 103, peripheral railroad section timetable information 104, a running curve 106, railroad track information 108, equipment information 111, operation acquisition information 113, and equipment update information 135. Note that the HDD may also store information input from the terminal device, such as the corresponding railroad section timetable information 101 and the peripheral railroad section timetable information 104.

Here, track circuit-related equipment refers to equipment in which its operation is determined based on the operation of the track circuit (designation of blocking or the like), and, for instance, considered may be signals and crossing gates.

When the corresponding railroad section timetable information 101 is input from a terminal device, the related timetable extraction unit 102 refers to the railroad section information 103 and the peripheral railroad section timetable information 104 based on the input corresponding railroad section timetable information 101, and extracts a related timetable of a railroad section (related timetable information) pertaining to the corresponding railroad section. Here, a related timetable refers to a timetable of a railroad section that is impacted from factors other than a corresponding timetable from the perspective of ground equipment. For example, in cases when there is a railroad section that is parallel to the corresponding railroad section (peripheral railroad section disposed on the periphery of the corresponding railroad section), since the open/close operation of a crossing gate will depend on the corresponding railroad section and the parallel railroad section, it is necessary to also give consideration to the timetable of the parallel railroad section. Note that, when there is no related timetable, the related timetable may be omitted.

The train dynamic simulation unit 105 refers to the running curve 106, and simulates the service of each train listed in the corresponding timetable and the peripheral railroad section timetable extracted by the related timetable extraction unit 102 based on information registered in the running curve 106.

The on-rail section simulation unit 107 refers to the railroad track information 108 for comprehending the on-rail section, and generates on-rail section information at each point in time based on a dynamic obtained in the simulation of the train dynamic simulation unit 105. For example, the on-rail section simulation unit 107 generates on-rail section information regarding on which track circuit a certain train exists at each point in time.

The track circuit simulation unit 109 simulates an operation of the track circuit based on the on-rail section information generated by the on-rail section simulation unit 107, and the railroad track information 108. Specifically, the track circuit simulation unit 109 determines a state of adjacent track circuits based on a train interval control system according to the on-rail section information. For example, when the train interval control system is a system where the two rearward track circuits are blocked, blocking is set to the on-rail section and the two rearward track circuits of the on-rail section. Here, the track circuit simulation unit 109 can simulate the state of the track circuits according to the on-rail condition of each train listed in the timetable of the corresponding railroad section and the peripheral railroad section.

The track circuit-related equipment operation simulation unit 110 refers to a simulation result of the track circuit simulation unit 109, and the equipment information 111, and simulates an operation of the track circuit-related equipment based on the state of each track circuit, and the equipment information 111. The track circuit-related equipment existing in each track circuit can be comprehended from the simulation result. Here, the track circuit-related equipment operation simulation unit 110 can determine the operation of each track circuit-related equipment based on the blocked state. For example, a signal will flash in red when the on-rail section is blocked. Note that these track circuit-related equipment are controlled based on a train interval control system designated in each railroad section.

When a simulation result of the track circuit-related equipment operation simulation unit 110 is input, the track circuit-related equipment operation aggregation unit 112 refers to the operation acquisition information 113 of each equipment, and aggregates the state of the track circuit-related equipment. When aggregating the state of the track circuit-related equipment, the operation acquisition information 113 of each equipment is referenced and acquired. For example, for the lighting time of a signal, lighting state×interval time are aggregated, and the aggregated time is estimated as the total lighting time of the signal (operating quantity of the signal). For the crossing gate operation frequency, the time change of the operation of the equipment is referenced, and the series of operations where the crossing gate is raised and subsequently lowered is counted as one operation and aggregated, and the aggregated frequency is estimated as the total frequency of the crossing gate operation (operating quantity of the crossing gate). Note that, when aggregating the past operations of track circuit-related equipment, information of the corresponding equipment is additionally searched using a connecting equipment ID 611 of the equipment update information 135, a last updated date is referenced from an installation/updated date 613 (installation date when there is no updated date), the numerical value of the operation acquisition information is reset as of the last updated date, and subsequent operations are aggregated.

The operation output unit 114 outputs information aggregated by the track circuit-related equipment operation simulation unit 110 (for instance, total lighting time of the signal (operating quantity of the signal) and total frequency of the crossing gate operation (operating quantity of the crossing gate) to a display device, and displays the aggregated information the display device.

Figure 2:
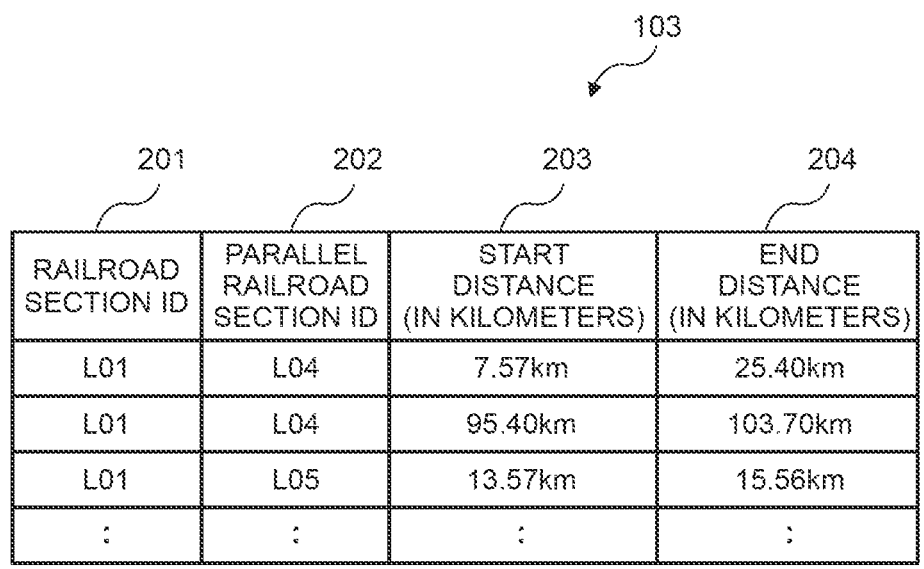
FIG. 2 is a configuration diagram of railroad section information.

FIG. 2 is a configuration diagram of railroad section information. In FIG. 2, the railroad section information 103 is information for managing a relation of a railroad section on which each train runs (corresponding railroad section) and a parallel railroad section which is parallel to the railroad section, and is configured from a railroad section ID 201, a parallel railroad section ID 202, a start distance (in kilometers) 203, and an end distance (in kilometers) 204. The railroad section ID 201 is an identifier for uniquely identifying the railroad section (corresponding railroad section). The railroad section ID 201 stores, for instance, "L01".

The parallel railroad section ID 202 is an identifier for uniquely identifying the parallel railroad section that is parallel to the railroad section. The parallel railroad section ID 202 stores, for instance, "L04" as the identifier of the parallel railroad section that is parallel to the railroad section "L01". The start distance (in kilometers) 203 is distance information regarding the start location of the railroad section, and is information indicating the distance from the reference location of the railroad section. The start distance (in kilometers) 203 stores, for instance, "7.57 km" as the information indicating the distance from the reference location of the railroad section "L01". The end distance (in kilometers) 204 is distance information regarding the end location of the railroad section, and is information indicating the distance from the reference location of the railroad section. The end distance (in kilometers) 204 stores, for instance, "25.40 km" as the information indicating the distance from the reference location of the railroad section "L01".

FIG. 3 is a configuration diagram of peripheral railroad section timetable information. In FIG. 3, the peripheral railroad section timetable information 104 is information for managing a timetable of each train which runs on a peripheral railroad section on a periphery of the corresponding railroad section, and is configured from a plurality of tables 30, 31, 32. The table 30 is configured from a railroad section ID 301, a train number 302, a train type 303, a station name 304, a track number 305, a departure/arrival/transit 306, and a time 307, the table 31 is configured from a train number 311, and a train model 312, and the table 32 is configured from a train number 321, a number of cars 322, and a total train length 323.

The railroad section ID 301 stores the same information as the railroad section ID 201 of FIG. 2. The train number 302 is a number for identifying the train which runs on the railroad section. The train number 302 stores, for instance, "T001" as the number of the train which runs on the railroad section "L01". The train type 303 is information for identifying the type of train which runs on the railroad section. The train type 303 stores, for instance, information of "rapid train" in cases where the train which runs on the railroad section "L01" is a "rapid train". The station name 304 is the name of the station located on the railroad section. The station name 304 stores information of "A station" when the name of the station located on the railroad section "L01" is "A station". The track number 305 is information indicating the track number of the train which runs through the station located on the railroad section. The track number 305 stores, for instance, information of "track number 2" when the train runs through track number 2 of A station located on the railroad section "L01". The departure/arrival/transit 306 is information indicating whether the train will leave the station, arrive at the station, or transit through the station. The departure/arrival/transit 306 stores, for instance, information of "arrival" when the train will arrive at track number 2 of A station located on the railroad section "L01". The time 307 is information indicating the departure time, the arrival time or the transit time of the train. The time 307 stores, for instance, information of "16:00:00" when the train will arrive at track number 2 of A station located on the railroad section "L01" at "16:00:00".

The train number 311 stores the same information as the train number 302. The train model 312 is information for identifying the train type of the train. The train model 312 stores, for instance, "SS01" as information for identifying the train type of the train of train number "T001". The train number 321 stores the same information as the train number

302. The number of cars 322 is information indicating the total number of cars configuring the train. The number of cars 322 stores, for instance, information of "8" when the train of train number "T001" is configured from 8 cars. The total train length 323 is information indicating the overall length of the train. The total train length 323 stores, for instance, information of "160 m" when the train of train number "T001" is configured from 8 cars and the overall length of the train is "160 m". Note that, while FIG. 3 illustrates the configuration of the peripheral railroad section timetable information 104, the corresponding railroad section timetable information 101 is also configured from the same information. Moreover, in this example, while the peripheral railroad section timetable information 104 is configured from three tables 30, 31, 32, the table configuration is not necessarily limited to this example. For example, information of the respective tables may also be summarized in a single table.

FIG. 4 is a configuration diagram of a running curve. In FIG. 4, the running curve 106 is information for managing the running curve between the stations located on the railroad section, and is configured from a railroad section ID 401, a start station 402, an end station 403, a start station transit/stop 404, an end station transit/stop 405, a distance (in kilometers) 406, a speed 407, an addition-subtraction speed 408, and an elapsed time 409.

The railroad section ID 401 stores the same information as the railroad section ID 201 of FIG. 2. The start station 402 is the name of the start station located at the start location of the railroad section. The start station 402 stores, for instance, information of "A station" when the name of the start station located at the start station of the railroad section "L01" is "A station". The end station 403 is the name of the end station located at the end location of the railroad section. The end station 403 stores, for instance, information of "B station" when the name of the end station located at the end location of the railroad section "L01" is "B station". The start station transit/stop 404 is information indicating whether the train will transit through or stop at the start station. The start station transit/stop 404 stores, for instance, information of "stop" when the train will stop at the start station. The end station transit/stop 405 is information indicating whether the train will transit through or stop at the end station. The end station transit/stop 405 stores, for instance, information of "transit" when the train will transit through the end station. The distance (in kilometers) 406 is information indicating the distance from the reference location of the railroad section of the start station. The speed 407 is information indicating the speed of the train which runs between the start station and the end station. The addition-subtraction speed 408 is information indicating the addition-subtraction speed of the train upon running between the start station and the end station. The elapsed time 409 is information indicating the time that the train will transit through the start station.

Figure 5:
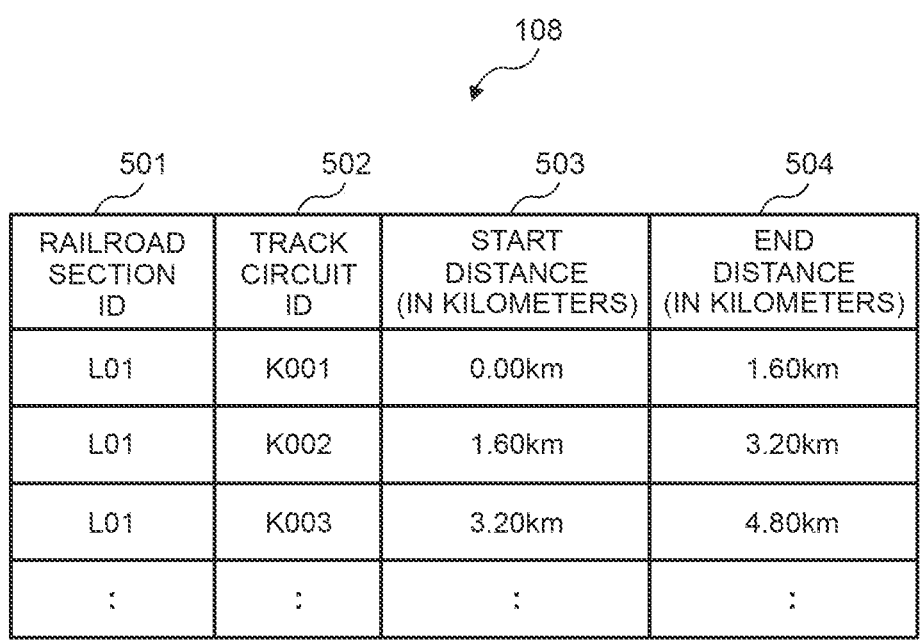
FIG. 5 is a configuration diagram of railroad track information.

FIG. 5 is a configuration diagram of railroad track information. In FIG. 5, the railroad track information 108 is information for managing the track circuits configuring the railroad section, and is configured from a railroad section ID 501, a track circuit ID 502, a start distance (in kilometers) 503, and an end distance (in kilometers) 504.

The railroad section ID 501 stores the same information as the railroad section ID 201 of FIG. 2. The track circuit ID 502 is an identifier for identifying a specific track circuit among a plurality of track circuits configuring the railroad section. The track circuit ID 502 stores, for instance, "K001" as the identifier for identifying a specific track circuit among a plurality of track circuits configuring the railroad section "L01". The start distance (in kilometers) 503 stores the same information as the start distance (in kilometers) 203 of FIG. 2. The end distance (in kilometers) 504 stores the same information as the end distance (in kilometers) 204 of FIG. 2.

FIG. 6 is a configuration diagram of equipment information and equipment update information. In FIG. 6, the equipment information 111 is information for managing equipment disposed on the track circuit of the railroad section (track circuit-related equipment), and is configured from a railroad section ID 601, a track circuit ID 602, a connecting equipment type 603, a connecting equipment ID 604, and an installation distance (in kilometers) 605. Furthermore, in FIG. 6, the equipment update information 135 is configured from a connecting equipment ID 611, an update frequency 612 indicating the update frequency of the corresponding equipment, and an installation/updated date 613 indicating the installation/updated date.

The railroad section ID 601 stores the same information as the railroad section ID 201 of FIG. 2. The track circuit ID 602 stores the same information as the track circuit ID 502 of FIG. 5. The connecting equipment type 603 is information for identifying the type of equipment to be connected to the track circuit of the railroad section. The connecting equipment type 603 stores, for instance, information of "signal" when the equipment to be connected to the track circuit "K001" of the railroad section "L01" is a "signal". The connecting equipment ID 604 is the identifier of the equipment to be connected to the track circuit of the railroad section. The connecting equipment ID 604 stores, for instance, "SG001" as the identifier of the "signal" as the equipment to be connected to the track circuit "K001" of the railroad section "L01". The installation distance (in kilometers) 605 is information indicating the distance from the reference location of the equipment to be connected to the track circuit of the railroad section. The installation distance (in kilometers) 605 stores, for instance, information of "0.00 km" as the distance from the reference location of the "signal" as the equipment to be connected to the track circuit "K001" of the railroad section "L01". The connecting equipment ID 611 stores the same information as the connecting equipment ID 604. The update frequency 612 stores the update frequency of the corresponding equipment. Note that 0 is stored for equipment that has not been updated after being installed. The installation/updated date 613 stores the date and time that the equipment was installed/updated.

Figures 7, 8:
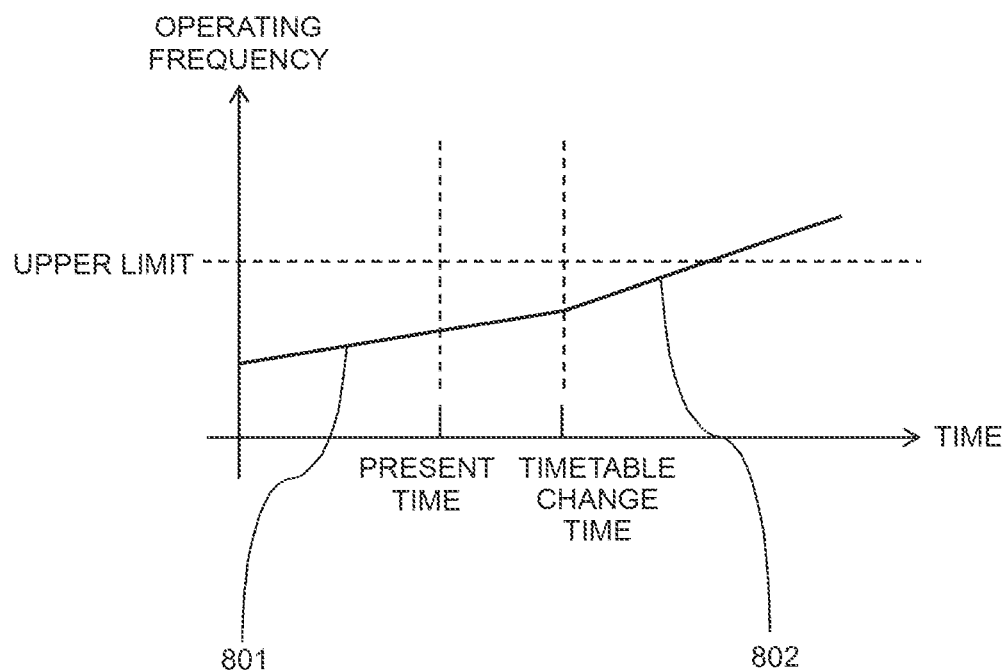
FIG. 7 is a configuration diagram of operation acquisition information.
FIG. 8 is an operating frequency characteristic diagram as an output example of the operation output unit and which shows the operating frequency of the equipment.

FIG. 7 is a configuration diagram of operation acquisition information. In FIG. 7, the operation acquisition information 113 is information for managing the relation of the device configuring the equipment to be connected to the track circuit of the railroad section and the acquisition information type, and is configured from a connecting device type 701, and an acquisition information type 702.

The connecting device type 701 is information for identifying the type of device configuring the equipment to be connected to the track circuit of the railroad section. The connecting device type 701 stores, for instance, information of "signal" when the device configuring the equipment to be connected to the track circuit is a "signal". The acquisition information type 702 is the type of information to be acquired for managing the device configuring the equipment to be connected to the track circuit. The acquisition information type 702 stores, for instance, information of "lighting time, lighting frequency" when the information to be acquired for managing the signal to be connected to the track circuit is "lighting time, lighting frequency".

FIG. 8 is an operating frequency characteristic diagram as an output example of the operation output unit and which shows the operating frequency of the equipment. In FIG. 8, the horizontal axis represents the time, and the vertical axis represents the operating frequency of the equipment (track circuit-related equipment). The vertical axis sets, as the upper limit, the operating frequency which refers to the replacement of the equipment pursuant to the degradation of the equipment. The present time refers to the timing in which the operating quantity of the respective equipment was aggregated by the track circuit-related equipment operation aggregation unit 112. Moreover, the timetable change time refers to the time that the timetable of each train which runs on the railroad section was changed.

The characteristic curves 801, 802 are the characteristic curves indicating the changes to the operating frequency of the equipment (operating quantity of the equipment). The characteristic curve 801 indicates the changes to the operating frequency of the equipment from before the present time to the timetable change time, with the present time as the borderline. Of the characteristic curve 801, the characteristics from the present time to the timetable change time indicate predicted values of the operating frequency of the equipment from the present time onward. Of the characteristic curve 802, the characteristics from the timetable change time onward indicate changes to the future operating frequency (change of predicted values) of the equipment. Note that the characteristic curves 801, 802 of the operating frequency from the timetable change time onward are the characteristics obtained as the corresponding railroad section timetable information 101 and the peripheral railroad section timetable information 104 based on the timetable information after the timetable change.

Figure 9:
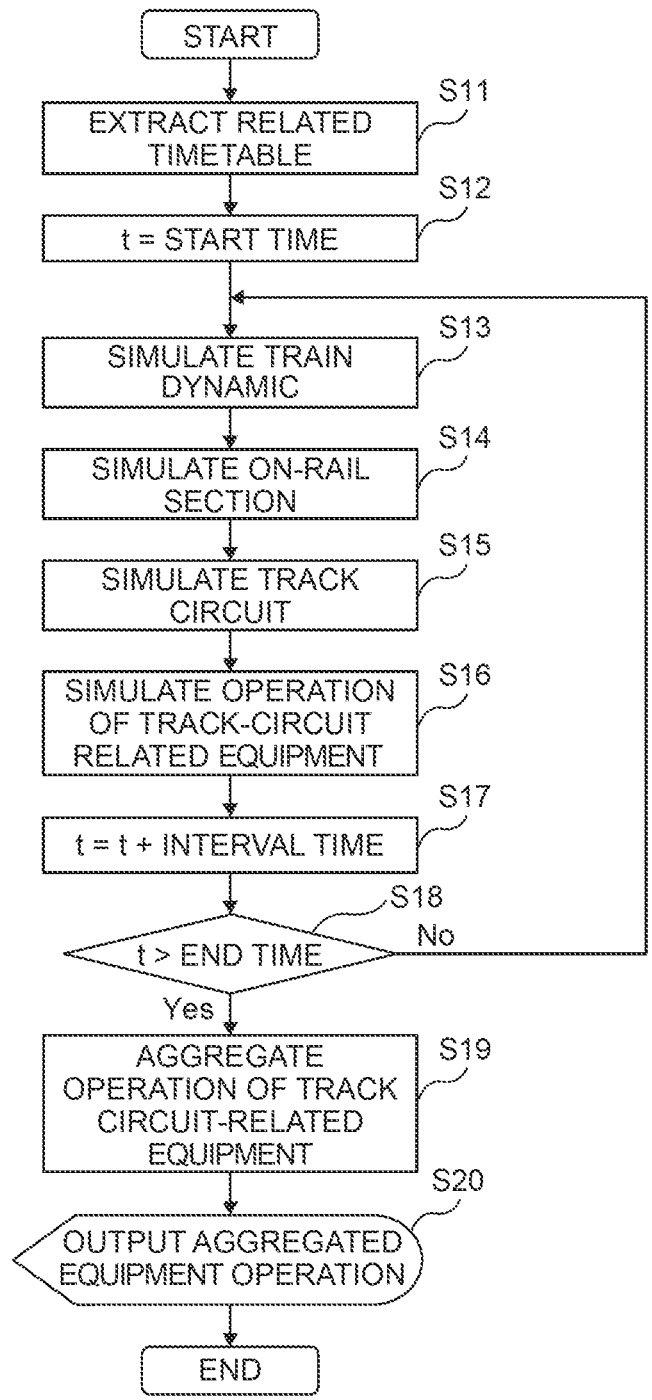
FIG. 9 is a flowchart explaining the processing of the first embodiment.

FIG. 9 is a flowchart explaining the processing of the first embodiment. In FIG. 9, foremost, the processor activates the related timetable extraction unit 102. When the corresponding railroad section timetable information 101 is input from a terminal device, the related timetable extraction unit 102 refers to the railroad section information 103 and the peripheral railroad section timetable information 104 based on the input corresponding railroad section timetable information 101, and extracts the related timetable of the peripheral railroad section pertaining to the corresponding railroad section (S11).

Here, the related timetable extraction unit 102 refers to the railroad section information 103 with the railroad section ID 201 as a search key, and acquires information stored in the parallel railroad section ID 202, the start distance (in kilometers) 203 and the end distance (in kilometers) 204, respectively.

Furthermore, the related timetable extraction unit 102 refers to the peripheral railroad section timetable information 10 with the parallel railroad section ID 202 as a search key, conducts a search 301 of the railroad section ID, and extracts a corresponding record. The extracted peripheral railroad section timetable is configured from information registered in the railroad section ID 301, the train number 302, the train type 303, the station name 304, the track number 305, the departure/arrival/transit 306, and the time 307, respectively. Based on the information of the extracted peripheral railroad section timetable, it is possible to know what train departed from which track number of which station at what time, or know when such train will arrive at which track number, or when such train will transit through which station. Moreover, by referring to the information registered in the total train length 323, it is possible to more realistically simulate the transition of the blocking of the track circuit, and, when the total train length is consequently long, it is possible to simulate that the time required for the crossing gate to be lowered will be long.

Subsequently, the processor sets the start time=t (S12), and subsequently activates the train dynamic simulation unit 105, the on-rail section simulation unit 107, the track circuit simulation unit 109, the track circuit-related equipment operation simulation unit 110, the track circuit-related equipment operation aggregation unit 112 and the operation output unit 114. Here, the train dynamic simulation unit 105, the on-rail section simulation unit 107 and the track circuit simulation unit 109 perform processing for each train ID listed in the corresponding timetable (corresponding railroad section timetable information) and the peripheral railroad section timetable (peripheral railroad section timetable information).

Next, the train dynamic simulation unit 105 refers to the running curve 106, and simulates the service of each train (train dynamic) listed in the corresponding timetable and the peripheral railroad section timetable extracted by the related timetable extraction unit 102 based on the information registered in the running curve 106 (S13).

Specifically, the train dynamic simulation unit 105 refers to the running curve 106 with the railroad section ID 401, the start station 402, the end station 403, the start station transit/stop 404, and the end station transit/stop 405 as the search key, searches for information of the running curve between certain stations, and extracts information registered in the distance (in kilometers) 406, the speed 407, the addition-subtraction speed 408, and the elapsed time 409, respectively. In the foregoing case, the train dynamic simulation unit 105 extracts information registered in the running curve 106 between all stations of the railroad section, and, by adding the "elapsed time" registered in the elapsed time 409 among the extracted information to the departure time (or transit time) of each station obtained from the corresponding railroad section timetable information 101, it is possible to comprehend the dynamic (distance (in kilometers), speed, addition-subtraction speed, elapsed time from the departing station (or the transit station)) of the train within the railroad section (train identified with the train ID). Note that, while this embodiment explains a case of estimating the future operation of the equipment, in cases of aggregating the past performance, the timetable of the performance of the corresponding day (timetable indicating the actual time of departure from, arrival to, or transit through the station) may be used in substitute for the planned timetable. Furthermore, in cases of aggregating the past performance, the running curve 106 may be replaced with the past train running information for implementation.

FIG. 14 is a configuration diagram of the train running information. In FIG. 14, the train running information 120 is stored on the HDD as information for managing the running state of each train which runs on the railroad section, and is configured from a railroad section ID 1401, a train number 1402, a date 1403, a time 1404, a distance (in kilometers) 1405, a speed 1406, an addition-subtraction speed 1407, notch information 1408.

The railroad section ID 1401 stores the same information as the railroad section ID 201 of FIG. 2. The train number 1402 stores the same information as the train number 302 of FIG. 3. The date 1403 is information indicating the date that the train ran on the railroad section. The time 1404 is information indicating the time that the train ran on the railroad section. The distance (in kilometers) 1405 stores the same information as the distance (in kilometers) 406 of FIG. 4. The speed 1406 stores the same information as the speed 407 of FIG. 4. The addition-subtraction speed 1407 stores the same information as the addition-subtraction speed 408 of FIG. 4. The notch information 1408 stores "2" as the notch information of the train which runs on the railroad section.

Figures 20, 21:
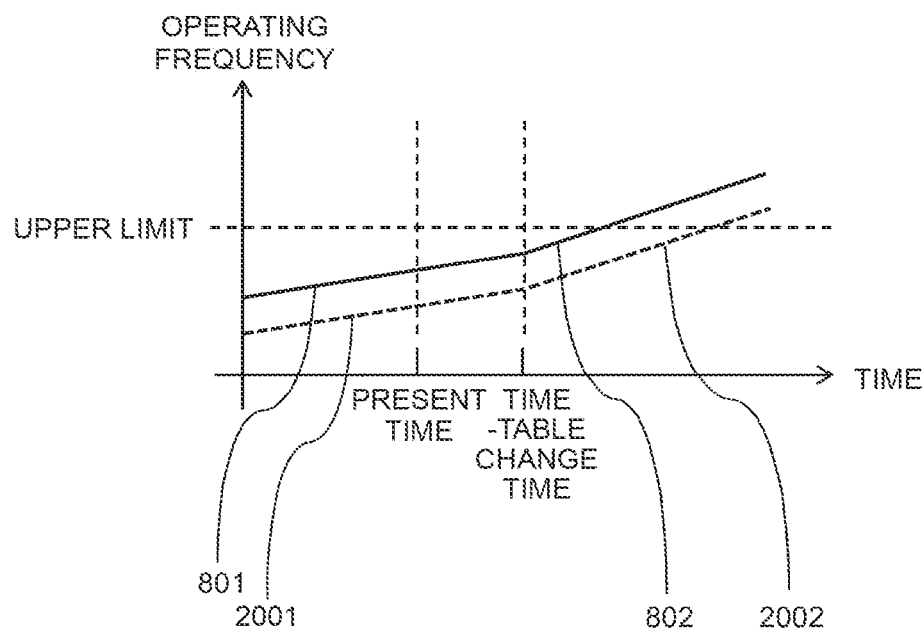
FIG. 20 is an operating frequency characteristic diagram as an output example of the operation output unit in the fifth embodiment and which shows the operating frequency of the equipment.
FIG. 21 is a station distance (in kilometers) information configuration diagram.

FIG. 21 is a configuration diagram of the station distance (in kilometers) information. In FIG. 21, the station distance (in kilometers) information 141 is stored on the HDD as information for managing the station distance (in kilometers), and is configured from a railroad section ID 2101, a station name 2102, and a distance (in kilometers) 2103.

The railroad section ID 2101 stores the same information as the railroad section ID of FIG. 3. The station name 2102 stores the same information as the station name 304 of FIG. 3. The distance (in kilometers) 2103 stores the length of the route from the starting station of each railroad section.

When the running curve 106 is to be replaced with the past service history information for implementation, the train dynamic simulation unit 105 acquires the railroad section ID 2101 of the corresponding railroad section of the distance (in kilometers) information 141, and the distance (in kilometers) information 2103 of the departing station and the destination station, respectively based on the station name 2102 of the departing station and the station name (2102) of the destination station between the corresponding stations. Subsequently, based on the distance (in kilometers) information 2103, the train dynamic simulation unit 105 refers to the corresponding railroad section ID 1401 and the distance (in kilometers) information 1405 from the train running information 120, and acquires records between the departing station distance (in kilometers) and the destination station distance (in kilometers). The acquired records will be information configured from the items of the date 1403, the time 1404, the train number 1402, the distance (in kilometers) 1405, the speed 1406, and the addition-subtraction speed 1407 between the departing station distance (in kilometers) and the destination station distance (in kilometers). These records show the series of dynamics from the departing station to the destination station for each train number 1402. By additionally conducting a search from these records with the time 1404 as the key based on a certain simulation time t, it is possible to acquire the location, the speed, and the addition-subtraction speed of each train at the simulation time t. Moreover, the elapsed time corresponding to the elapsed time 409 of the running curve 106 can be obtained by subtracting the time of the departing station for each train number 1402. When aggregating the past performance, the running curve 106 can be replaced with the past train running information for implementation. Note that the running curve 106 may be entirely replaced with train running information for implementation, or the train running information and the running curve may be combined for implementation. When the implementation is to be carried out based on the foregoing combination, for instance, when there is a deficiency in the train running information, the running curve may be used to supplement such deficiency.

Next, the on-rail section simulation unit 107 and the track circuit simulation unit 109 perform processing based on the elapsed time from the departing station (or from the transit station) obtained with the train dynamic simulation unit 105.

Foremost, the on-rail section simulation unit 107 acquires the on-rail section information at each point in time based on the dynamic obtained with the train dynamic simulation unit 105 (S14). Specifically, the on-rail section simulation unit 107 refers to the railroad track information 108 with the railroad section ID 501, the start distance (in kilometers) 503, and the end distance (in kilometers) 504 as the search key, and acquires information registered in the track circuit ID 502. The acquired information configures the on-rail section information indicating which train (train identified with the train ID) exists on which track circuit (track circuit identified with the track circuit ID). Moreover, the on-rail section simulation unit 107 can simulate when the track circuit, which was once on-rail, will no longer be on-rail by referring to the information registered in the total train length of the corresponding railroad section timetable information 101.

Next, the track circuit simulation unit 109 simulates the operation of the track circuit based on the on-rail section information generated by the on-rail section simulation unit 107, and the railroad track information 108 (S15). Specifically, the track circuit simulation unit 109 determines the state of adjacent track circuits based on the train interval control system according to the on-rail section information. For example, when the train interval control system is a system where the two rearward track circuits are blocked, blocking is set to the on-rail section and the two rearward track circuits of the on-rail section. Here, the track circuit simulation unit 109 can simulate the state of the track circuits according to the on-rail condition of each train listed in the timetable of the corresponding railroad section and the peripheral railroad section.

Next, the track circuit-related equipment operation simulation unit 110 refers to a simulation result of the track circuit simulation unit 109, and the equipment information 111, and simulates an operation of the track circuit-related equipment based on the state of each track circuit, and the equipment information 111 (S16). Specifically, the track circuit-related equipment operation simulation unit 110 refers to the equipment information 111 with the railroad section ID 601 and the track circuit ID 602 as the search key, and acquires information registered in the connecting equipment type 603, the connecting equipment ID 604, and the installation distance (in kilometers) 605, respectively. It is possible to comprehend the track circuit-related equipment in each track circuit from the acquired information (simulation result). Here, the track circuit-related equipment operation simulation unit 110 can determine the operation of each track circuit-related equipment based on the blocked state. For example, a signal will flash in red when the on-rail section is blocked. Note that these track circuit-related equipment are controlled based on a train interval control system designated in each railroad section.

Next, the processor sets the time t=t+interval time (S17), and determines whether the time t exceeded the end time (S18). Upon obtaining a negative determination result in step S18, the processor returns to the processing of step S13, activates the train dynamic simulation unit 105, and repeats the processing of step S13 to step S18. Upon obtaining a positive determination result in step S18, the processor activates the track circuit-related equipment operation aggregation unit 112.

Subsequently, when a simulation result of the track circuit-related equipment operation simulation unit 110 is input, the track circuit-related equipment operation aggregation unit 112 refers to the operation acquisition information 113 of each equipment, and aggregates the state (operating quantity) of the track circuit-related equipment (S19). In the foregoing case, the track circuit-related equipment operation aggregation unit 112 refers to the operation acquisition information 113 with the connecting device type 701 as the search key, and acquires information registered in the acquisition information type 702. The state (operating quantity) of the connecting equipment is aggregated by using the information registered in the acquisition information type 702; for instance, in the case of a signal, information such as "lighting time" and "lighting frequency". Moreover, when the acquisition information type is determined, the track circuit-related equipment operation aggregation unit 112 consequently aggregates the operating quantity of the equipment simulated by the track circuit-related equipment operation simulation unit 110. For example, for the lighting time of a signal, lighting state×interval time are aggregated, and the aggregated time is estimated, and managed, as the total lighting time of the signal (operating quantity of the signal). For the crossing gate operation frequency, the time change of the operation of the equipment is referenced, and the series of operations where the crossing gate is raised and subsequently lowered is counted as one operation and aggregated, and the aggregated frequency is estimated, and managed, as the total frequency of the crossing gate operation (operating quantity of the crossing gate).

Next, the operation output unit 114 outputs information aggregated by the track circuit-related equipment operation simulation unit 110 (for instance, total lighting time of the signal (operating quantity of the signal) and total frequency of the crossing gate operation (operating quantity of the crossing gate) to a display device, and displays the aggregated information the display device (S20), and then ends the processing of this routine.

The screen of the display device displays, as shown in FIG. 8, information aggregated by the track circuit-related equipment operation simulation unit 110; for instance, the operating frequency (total frequency) of the crossing gate obtained by aggregating the operating frequency for each set-up timing, as the characteristics indicating the operating quantity of the crossing gate. The display example of FIG. 8 indicates the changes to the operating frequency of the equipment from before the present time to the timetable change time, with the present time as the borderline. Of the characteristic curve 801, the characteristics from the present time to the timetable change time indicate predicted values of the operating frequency of the equipment from the present time onward. Note that, when the information aggregated by the track circuit-related equipment operation simulation unit 110 is the total lighting time of the signal (operating quantity of the signal) obtained by aggregating the operating time for each set-up timing, the characteristics indicating the total lighting time of the signal (operating quantity of the signal) are displayed on the screen of the display device.

Moreover, of the characteristic curve 802, the characteristics from the timetable change time onward indicate changes to the future operating frequency (change of predicted values) of the equipment. Here, while the value of the performance may be obtained as the operating frequency up to the present time, the value estimated with the method explained in this embodiment may also be used. With regard to the future operating frequency of the equipment, the value of the operating frequency predicted with the method of this embodiment is used. Note that, while the operating frequency of the equipment is displayed in the timetable change time, this indicates that the number of timetable services has changed from the timetable change time, and the impact thereof is impacting the changes to the operating frequency of the equipment. Accordingly, when the method of this embodiment is used, it is possible to estimate the change in impact after the condition is changed, and accurately indicate when an abnormality will occur.

Note that, the range of simulating the operation of the equipment by changing the time is from the train dynamic simulation processing (S13) to the track circuit-related equipment operation simulation processing (S16), and, after performing the various simulations from the start time to the end time, the results are aggregated in the track circuit-related equipment operation aggregation processing (S19).

Here, when the crossing gate operation frequency is predicted (estimated), for instance, as the future operating frequency of the equipment based on the timetable information of each train, the track circuit-related equipment operation aggregation unit 112 can predict (estimate) the degradation of the crossing gate based on the prediction result (estimation result) according to Formula (1) below.

[Math 1]

$$\text{Degradation level } Y_t = a \times X_t + b \quad (1)$$

a: Weight coefficient for estimating degradation from crossing gate operation frequency
b: Previous degradation level
$X_t$: Crossing gate operation frequency that increased after lapse of t time from current time Furthermore, when t exceeding degradation level $Y_t$>threshold S is obtained and the degradation level $Y_t$ exceeds the threshold S, the track circuit-related equipment operation aggregation unit 112 can cause the operation output unit 114 to output display information to the effect of urging the repair of the crossing gate.

Moreover, when the crossing gate operating time is predicted (estimated), for instance, as the future operating time of the equipment based on the timetable information of each train, the track circuit-related equipment operation aggregation unit 112 can predict (estimate) the degradation of the crossing gate based on the prediction result (estimation result) according to Formula (2) below.

[Math 2]

$$\text{Degradation level } Y_t = a \times X_t + b \quad (2)$$

a: Weight coefficient for estimating degradation from crossing gate operating time
b: Previous degradation level
$X_t$: Cumulative operating time from current time to after lapse of t time $X_t$ as the cumulative operating time can be obtained based on whether or not the crossing gate is being operated for each corresponding time of predictive simulation in cases of executing predictive simulation at fixed intervals.

In this embodiment, the processing unit (related timetable extraction unit 102, train dynamic simulation unit 105, on-rail section simulation unit 107, track circuit simulation unit 112 and track circuit-related equipment operation simulation unit 110) can simulate, as the operation mode of the equipment, at least one of either the operating frequency or the operating time of the equipment based on the corresponding railroad section timetable information 101, and can simulate, as the operation mode of the equipment, at least one of either the past operating frequency or the past operating time of the equipment by using the past corresponding railroad section timetable information indicating the past timetable of each train as the corresponding railroad section timetable information 101. Here, the estimation unit (track circuit-related equipment operation aggregation unit 112 and operation output unit 114) can aggregate the operating quantity of each track circuit-related equipment from the simulation result of the processing unit, and estimate the degradation of each track circuit-related equipment from the aggregation result.

Moreover, in this embodiment, the processing unit can input the peripheral railroad section timetable information 104 which manages a timetable of each train which runs on a peripheral railroad section disposed on a periphery of the corresponding railroad section, and simulates, as an operation mode of the equipment, at least one of either an operating frequency or an operating time of equipment among each of the equipment that is impacted by the peripheral railroad section timetable information 104 based on each piece of timetable information that was input and the equipment information 111 which manages a relation of equipment, which is disposed on each of the railroad sections, and each of the railroad sections, in addition to the corresponding railroad section timetable information 101.

Furthermore, the processing unit can simulate a travel transition of each train existing in the corresponding railroad section timetable information 101 as a dynamic of each of the trains based on the corresponding railroad section timetable information 101 and the running curve 106 between the stations existing in the corresponding railroad section, simulate a state change of each of the track circuits based on the simulation result and the railroad track information 108 which manages a length of a plurality of track circuits existing in the corresponding railroad section, and simulate an operational change of equipment disposed on each of the track circuits based on the simulation result and the equipment information 111 which manages a relation of equipment, which is disposed on each of the track circuits, and each of the track circuits. In the foregoing case, the estimation unit (track circuit-related equipment operation aggregation unit 112 and operation output unit 114) can aggregate the simulation results indicating the operational change of the equipment disposed on each of the track circuits, and estimate the degradation of the equipment disposed on each of the track circuits from the aggregation result.

According to this embodiment, it is possible to simulate the operation of the track circuit-related equipment based on the corresponding railroad section timetable information 101, aggregate the operating quantity of each track circuit-related equipment from the simulation result, and estimate the degradation of each track circuit-related equipment from the aggregation result. Here, because it is possible to estimate the degradation of numerous types of ground equipment in comparison to conventional methods, as well as predict and aggregate the future operation of the ground equipment, it is possible to make a forecast on when an abnormality will occur in the respective ground equipment.

Second Embodiment

In this embodiment, the operation of equipment related to an interlocking device (equipment to be controlled by the interlocking device) is estimated. Here, equipment related to an interlocking device refers to equipment in which is operated based on the operation of the interlocking device, and, for instance, considered may be home signals and points.

Figure 10:
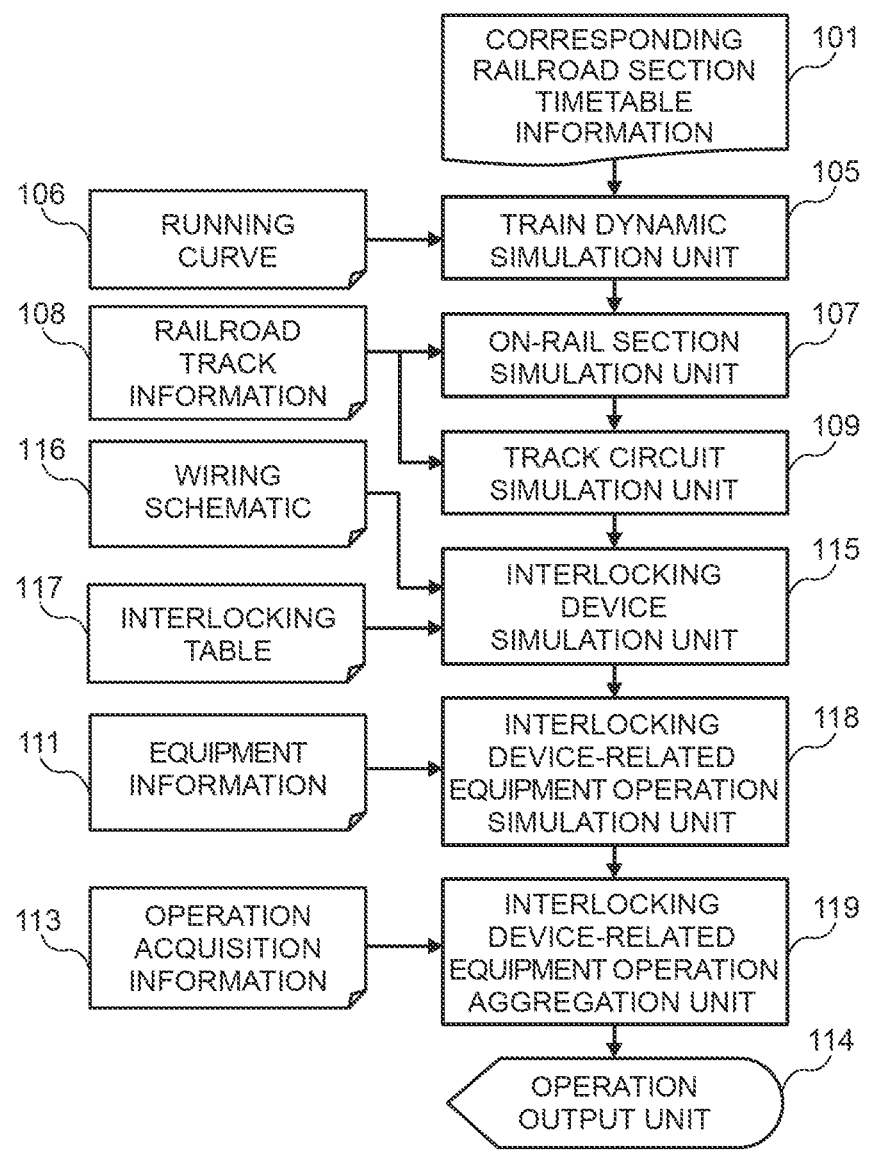
FIG. 10 is a configuration diagram showing the second embodiment of the degradation estimation system of railroad ground equipment according to the present invention.

FIG. 10 is a configuration diagram showing the second embodiment of the degradation estimation system of railroad ground equipment according to the present invention. In FIG. 10, the degradation estimation device of railroad ground equipment in this embodiment is configured by deleting the related timetable extraction unit 102, the railroad section information 103 and the peripheral railroad section timetable information 104 shown in FIG. 1, adding an interlocking device simulation unit 115, a wiring schematic 116 and an interlocking table 117, and arranging an interlocking device-related equipment operation simulation unit 118 and an interlocking device-related equipment operation aggregation unit 119 in substitute for the track circuit-related equipment operation simulation unit 110 and the track circuit-related equipment operation aggregation unit 112, and the remaining configuration is the same as the first embodiment shown in FIG. 1, and the explanation is omitted for same configurations. Note that the wiring schematic 116 and the interlocking table 117 are stored in the HDD. Moreover, the interlocking device simulation unit 115 and the interlocking device-related equipment operation simulation unit 118 are configured as one element of the processing unit, the interlocking device-related equipment operation aggregation unit 119 is configured as one element of the estimation unit, respectively stored in the memory, and activated by the processor.

The interlocking device simulation unit 115 simulates an output of the interlocking device based on the wiring schematic 116 and the interlocking table 117, and based on the state of each track circuit determined by the track circuit simulation unit 109. The interlocking device-related equipment operation simulation unit 118 refers to the equipment information 111 based on the state of the track circuit and the track number information obtained from the timetable information, and determines the state of railroad ground equipment such as signals and points. The interlocking device-related equipment operation aggregation unit 119 aggregates the operation history of the respective equipment based on the interlocking device-related equipment information simulated by the interlocking device-related equipment operation simulation unit 118, and the operation acquisition information 113.

Figure 11:
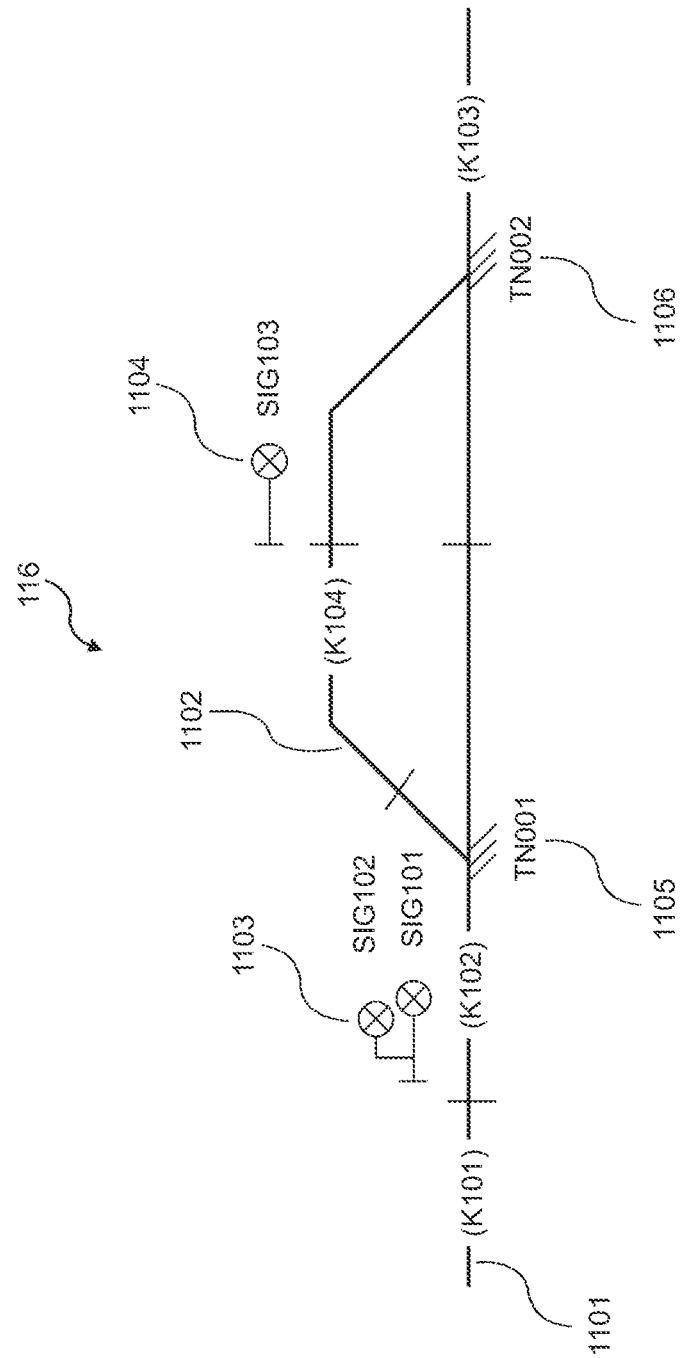
FIG. 11 is a configuration diagram of a wiring schematic.

FIG. 11 is a configuration diagram of a wiring schematic. In FIG. 11, the wiring schematic 116 is a diagram for managing the connection relation of the equipment to be controlled by the interlocking device, and the track circuit, and a railroad track 1102 is connected to a railroad track 1101 around the station. The railroad track 1101 configuring the main line is configured from track circuits K101, K102, K103, and the railroad track 1102 configuring the branch line is configured from a track circuit K104 which is branched from the track circuit K102 and connected to the track circuit K103. A main line SIG101 and a branch line SIG102 as a home signal 1103 are connected to the track circuit K102, and a leaving signal 1104 is connected to the track circuit K104. Moreover, a point 1105 is disposed between the track circuit K102 and the track circuit K104, and a point 1106 is connected between the track circuit K104 and the track circuit K103.

Figure 12:
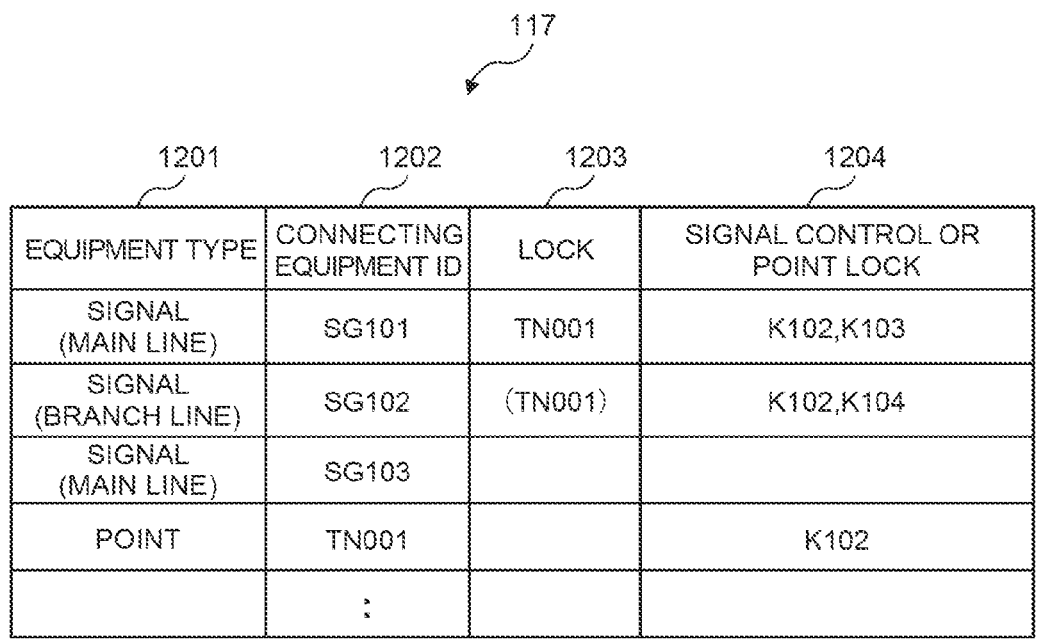
FIG. 12 is a configuration diagram of an interlocking table in a track circuit.

FIG. 12 is a configuration diagram of an interlocking table in a track circuit. In FIG. 12, the interlocking table 117 is a table for managing a relation of equipment to be controlled by the interlocking device and the control contents of the interlocking device upon controlling the equipment, and is configured from equipment type 1201, a connecting equipment ID 1202, a lock 1203, and a signal control 1204. The equipment type 1201 is information indicating the type of equipment to be controlled by the interlocking device. The equipment type 1201 stores, for instance, information of "signal (main line)" when the equipment to be controlled by the interlocking device is a "main line signal". The connecting equipment ID 1202 is an identifier for uniquely identifying the equipment to be controlled by the interlocking device. The connecting equipment ID 1202 stores, for instance, information of "SG101" when the identifier of the "main line signal" is "SG101". The lock 1203 is information for identifying the equipment to be locked by the interlocking device. The lock 1203 stores, for instance, "TN001" as the information for identifying "point" when the equipment to be locked by the interlocking device is a "point". Note that "(TN001)" is stored when the "point" is inverted. The signal control 1204 is information for identifying the target of the signal control of the interlocking device. The signal control 1204 stores, for instance, "K102, K103" as information for identifying the "track circuit" when the target of the signal control of the interlocking device is a "track circuit".

The interlocking device simulation unit 115 determines the state of railroad ground equipment such as signals and points based on the state of the track circuit, and the track number information obtained from the timetable information. For example, when the track is on-rail of the track circuit K101 of FIG. 11 and will advance to the branch line of the track circuit K104, the interlocking device simulation unit 115 selects "(TN001)" as the lock 1203 with reference to the information of the signal (branch line) of the interlocking table 117 of FIG. 12, and determines the state of the related track circuit. Once the state of the track circuit and the state of the ground equipment are determined, processing by the interlocking device-related equipment operation aggregation unit 119 is performed. Note that, while the track circuit can be controlled according to various methods, this embodiment does not limit the method, and a method according to the circumstances of the respective railroad sections is selected and executed. It is thereby possible to simulate the interlocking device, and simulate the operation of the respective interlocking device-related equipment operation aggregation units.

The interlocking device-related equipment operation aggregation unit 119 aggregates the operation history of the respective equipment (operating quantity of the equipment) based on the interlocking device-related equipment information simulated by the interlocking device-related equipment operation simulation unit 118, and the operation acquisition information 113. For the actual aggregation method and estimation method, the same processing as the track circuit-related equipment operation aggregation unit 112 of FIG. 1 can be adopted.

According to this embodiment, it is possible to simulate an operation mode of equipment to be controlled by the interlocking device based on the corresponding railroad section timetable information 101, aggregate the operating quantity of the equipment to be controlled by the interlocking device from the simulation result, and estimate the degradation of the equipment to be controlled by the interlocking device from the aggregation result.

Third Embodiment

In this embodiment, support information for estimating the degradation of equipment is generated regarding the equipment that is impacted by the dynamic of the train. Here, as the equipment that is impacted by the dynamic of the train, considered may be, for example, rails and trolley lines. The degradation of these equipment is considered to be impacted by the transit frequency, the transit speed, and the addition-subtraction speed during the transit of the train.

Figure 13:
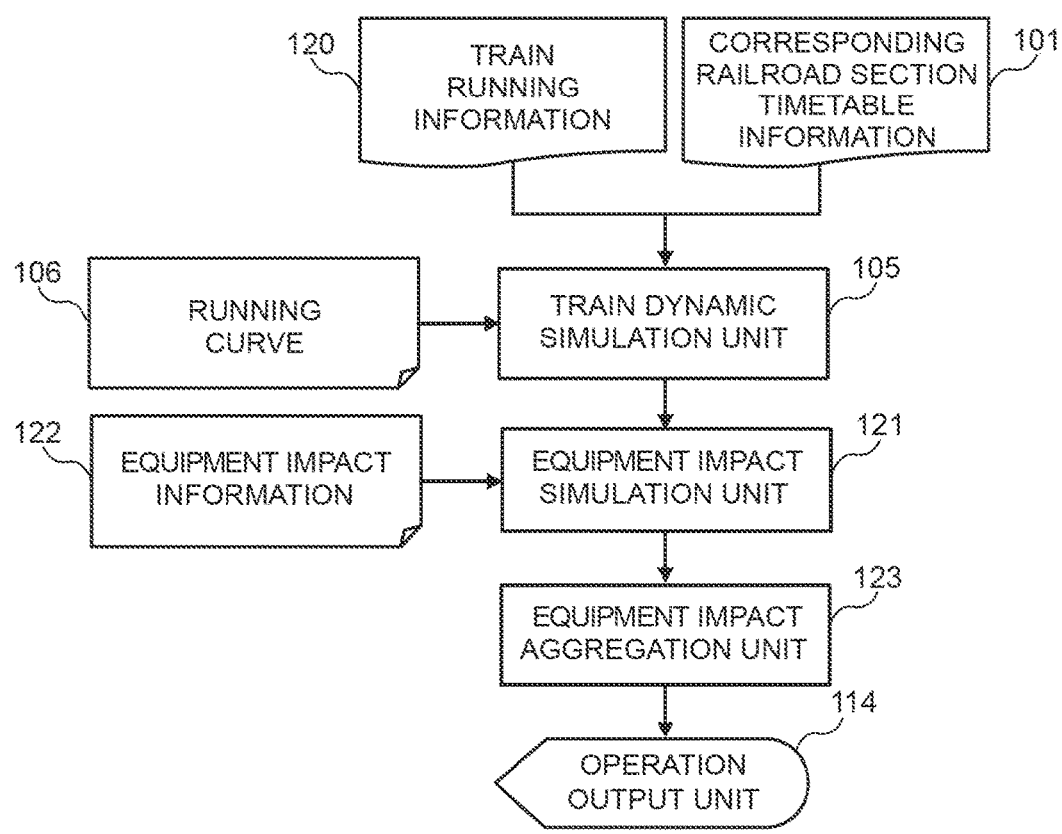
FIG. 13 is a configuration diagram showing the third embodiment of the degradation estimation system of railroad ground equipment according to the present invention.

FIG. 13 is a configuration diagram showing the third embodiment of the degradation estimation system of railroad ground equipment according to the present invention. In FIG. 13, the degradation estimation device of railroad ground equipment in this embodiment is configured by comprising a train dynamic simulation unit 105, equipment impact simulation unit 121, equipment impact aggregation unit 123, and an operation output unit 114. The equipment impact simulation unit 121 is configured as one element of the processing unit, the equipment impact aggregation unit 123 is configured as one element of the estimation unit, respectively stored in the memory, and activated by the processor.

The train dynamic simulation unit 105 simulates (comprehends) the train running at each location based on the train running information 120 indicating the service performance of each train in addition to the corresponding railroad section timetable information 101 and the running curve 106. Here, the train dynamic simulation unit 105 simulates, as the train dynamic, the train running at each location regarding all trains included in the corresponding railroad section timetable information 101. The equipment impact simulation unit 121 calculates the impact of the equipment based on the train dynamic obtained with the train dynamic simulation unit 105, and the equipment impact information 122. Here, the equipment impact simulation unit 121 calculates the impact of the equipment regarding all trains included in the corresponding railroad section timetable information 101. The equipment impact aggregation unit 123 aggregates the impact evaluation of the equipment based on the calculation result (simulation result) of the equipment impact simulation unit 121. This aggregation result can be used as the support information for estimating the degradation of the equipment that is impacted by the dynamic of the train. The operation output unit 114 outs the information aggregated by the equipment impact aggregation unit 123 to, for example, the display device.

FIG. 14 is a configuration diagram of train running information. In FIG. 14, the train running information 120 is stored on the HDD as the information for managing the running state of each train which runs on the railroad section, and is configured from a railroad section ID 1401, a train number 1402, a date 1403, a time 1404, a distance (in kilometers) 1405, a speed 1406, an addition-subtraction speed 1407, and notch information 1408.

The railroad section ID 1401 stores the same information as the railroad section ID 201 of FIG. 2. The train number 1402 stores the same information as the train number 302 of FIG. 3. The date 1403 is information indicating the date that the train ran on the railroad section. The time 1404 is information indicating the time that the train ran on the railroad section. The distance (in kilometers) 1405 stores the same information as the distance (in kilometers) 406 of FIG. 4. The speed 1406 stores the same information as the speed 407 of FIG. 4. The addition-subtraction speed 1407 stores the same information as the addition-subtraction speed 408 of FIG. 4. The notch information 1408 stores "2" as the notch information of the train which runs on the railroad section.

Figures 15, 16:
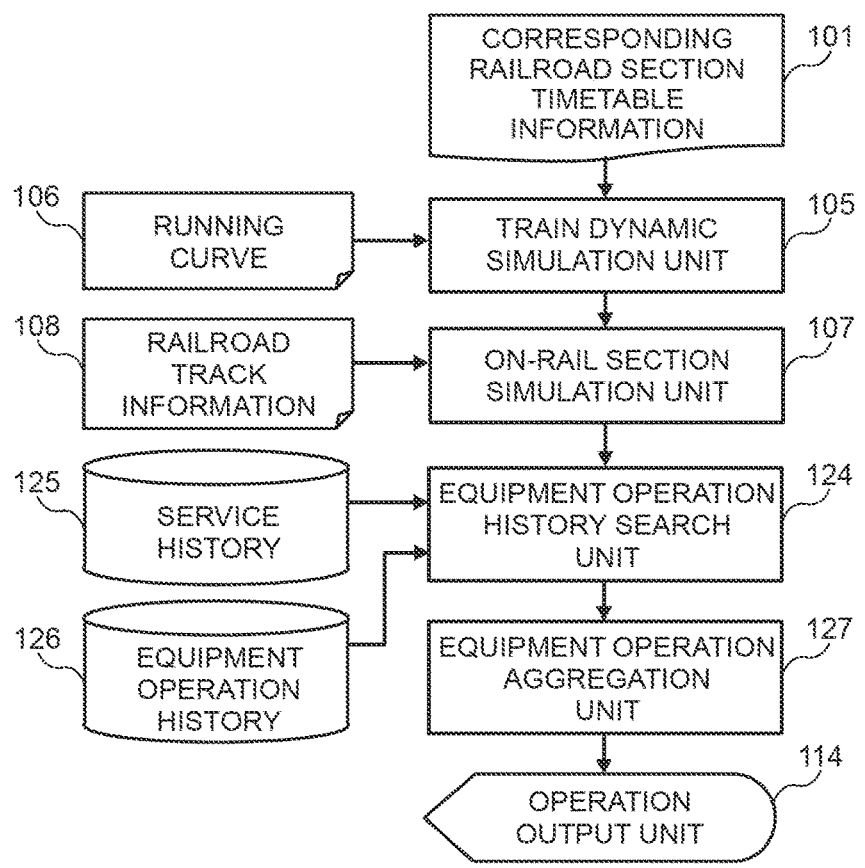
FIG. 15 is a configuration diagram of equipment impact information.
FIG. 16 is a configuration diagram showing the fourth embodiment of the degradation estimation system of railroad ground equipment according to the present invention.

FIG. 15 is a configuration diagram of equipment impact information. In FIG. 15, the equipment impact information 122 is stored on the HDD as information for managing a relation of the equipment disposed on the railroad section and the impact evaluation, and is configured from an device type 1501, and an impact evaluation 1502.

The device type 1501 is information indicating the type of equipment configuration the equipment that will be impacted by the dynamic of the train. The device type 1501 stores, for instance, information of "rails" when the equipment that will be impacted by the dynamic of the train is "rails". The impact evaluation 1502 is an item for evaluating the impact of the equipment that will be impacted by the dynamic of the train. The impact evaluation 1502 stores, for instance, information of "addition-subtraction speed" when the "rails" will be impacted by the "addition-subtraction speed" of the train among the dynamics of the train.

In this embodiment, the train dynamic simulation unit 105 simulates, as the train dynamic, the train running at each location based on the train running information 120 indicating the service performance of each train in addition to the corresponding railroad section timetable information 101 and the running curve 106. Here, the train dynamic simulation unit 105 refers to the train running information 120 with the railroad section ID 1401 and the train number 1402 as the search key, and acquires information stored in the date 1403, the time 1404, the distance (in kilometers) 1405, the speed 1406, the addition-subtraction speed 1407, and the notch information 1408, respectively.

The equipment impact simulation unit 121 calculates the impact of the equipment by using the train dynamic obtained with the train dynamic simulation unit 105, and the equipment impact information 122. Here, the equipment impact simulation unit 121 refers to the equipment impact information 122 with the device type 1501 as the search key, extracts the information of the impact evaluation 1502 corresponding to the type stored in the device type 1501, and performs the impact evaluation of the equipment based on the extracted information. For example, when the equipment impact simulation unit 121 selects "rails" as the device type 1501 and selects "addition-subtraction speed" as the impact evaluation 1502, the equipment impact simulation unit 121 executes the impact evaluation of the impacted "rails" based on the information registered in the addition-subtraction speed 1407 of the train running information 120.

The equipment impact aggregation unit 123 aggregates the impact evaluation output by the equipment impact simulation unit 121. Here, the equipment impact aggregation unit 123 can generate support information for estimating the degradation of the equipment that is impacted by the dynamic of the train by aggregating the impact evaluation output by the equipment impact simulation unit 121. For the actual aggregation method and estimation method, the same processing as the track circuit-related equipment operation aggregation unit 112 of FIG. 1 can be adopted.

Here, when predicting the degradation of rails as the equipment that will be impacted by the dynamic of the train based on the timetable information of each train, the equipment impact aggregation unit 123 can predict the degradation of the rails according to Formula (3) below.

[Math 3]

$$\text{Degradation level } Yt = a \times X1t + b \times X2t + c \times X1t \times X2t + d \quad (3)$$

a: Weight coefficient for estimating degradation from passing tonnage
b: Weight coefficient for estimating degradation from addition-subtraction speed
c: Weight coefficient for estimating degradation from product of passing tonnage and addition-subtraction speed
d: Degradation up to time t
$X1t$: Passing tonnage from current time to after lapse of t time Passing tonnage=$\Sigma$passing train$\times$train weight
$X2t$: Absolute sum of addition-subtraction speed from current time to after lapse of t time Absolute sum of addition-subtraction speed=$\Sigma$|addition-subtraction speed of passing train|

According to this embodiment, it is possible to simulate the operation mode of the equipment that will be impacted by the dynamic of the train based on the corresponding railroad section timetable information 101, aggregate the operating quantity (operation history) of the equipment that will be impacted by the dynamic of the train from the simulation result, and estimate the degradation of the equipment that will be impacted by the dynamic of the train from the aggregation result.

Fourth Embodiment

In this embodiment, the operation mode of the equipment is estimated from the past history without simulating the track circuit or the interlocking device, and the operating quantify related to the future degradation of the equipment is estimated.

FIG. 16 is a configuration diagram showing the fourth embodiment of the degradation estimation system of railroad ground equipment according to the present invention. In FIG. 16, the degradation estimation device of railroad ground equipment in this embodiment is configured from a train dynamic simulation unit 105, an on-rail section simulation unit 107, equipment operation history search unit 124, equipment operation aggregation unit 127, and an operation output unit 114. Note that the equipment operation history search unit 124 is configured as one element of the processing unit, the equipment operation aggregation unit 127 is configured as one element of the estimation unit, respectively stored in the memory, and activated by the processor.

When the corresponding railroad section timetable information 101 is input, the train dynamic simulation unit 105 refers to the running curve 106, and simulates the dynamic of the train. Here, the train dynamic simulation unit 105 simulates, as the train dynamic, the training running at each location regarding all trains included in the timetable information of the corresponding railroad section. The on-rail section simulation unit 107 refers to the railroad track information 108 based on the simulation result of the train dynamic simulation unit 105, and generates on-rail section information of each train. Here, the on-rail section simulation unit 107 generates on-rail section information indicating on which track circuit each train exists regarding all trains included in the corresponding railroad section timetable information 101.

When the on-rail section information of each train is input from the on-rail section simulation unit 107, the equipment operation history search unit 124 refers to the service history 125 and the equipment operation history 126, and searches for the most similar case example from the past history based on the on-rail section information of each train. The equipment operation aggregation unit 127 aggregates the search result of the equipment operation history search unit 124 as the operation (operating quantity) of the equipment, and outputs the aggregation result to the operation output unit 114. The operation output unit 114 outputs the information aggregated by the equipment operation aggregation unit 127 to, for example, the display device.

FIG. 17 is a configuration diagram of service history information. In FIG. 17, the service history 125 is stored on the HDD as information for managing the service history of each train which runs on the railroad section, and is configured from a railroad section ID 1701, a train number 1702, a station name 1703, a track number 1704, a departure/arrival/transit 1705, an implementation date 1706, an implementation time 1707, an on-rail section 1708, a distance (in kilometers) 1709, and a speed 1710.

The railroad section ID 1701 stores the same information as the railroad section ID of FIG. 3. The train number 1702 stores the same information as the train number 302 of FIG. 3. The station name 1703 stores the same information as the station name 304 of FIG. 3. The track number 1704 stores the same information as the track number 305 of FIG. 3. The departure/arrival/transit 1705 stores the same information as the departure/arrival/transit 306 of FIG. 3. The implementation date 1706 stores information of the date that the service history of each train was stored. The implementation time 1707 stores information indicating the time (hour: minute:second) that the service history of each train was stored. The on-rail section 1708 stores information of the track circuit on which each train is on-rail. The distance (in kilometers) 1709 stores the same information as the distance (in kilometers) 406 of FIG. 4. The speed 1710 stores the same information as the speed 407 of FIG. 4.

Figure 18:
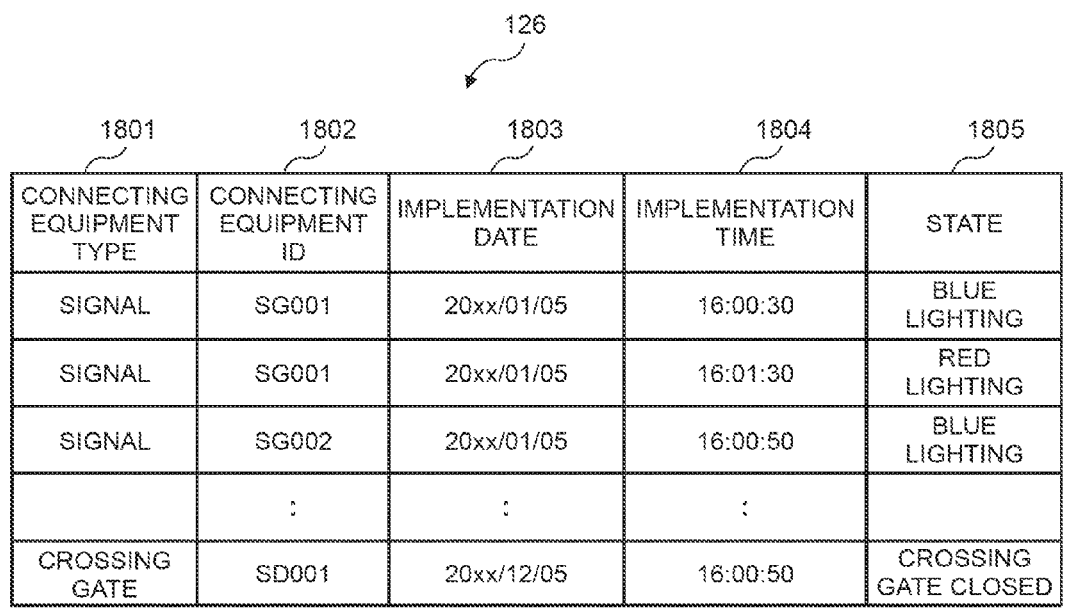
FIG. 18 is a configuration diagram of equipment operation history information.

FIG. 18 is a configuration diagram of equipment operation history information. In FIG. 18, the equipment operation history 126 is stored on the HDD as information for managing the operation history of each equipment disposed on the railroad section, and is configured from a connecting equipment type 1801, a connecting equipment ID 1802, an implementation date 1803, an implementation time 1804, and a state 1805.

The connecting equipment type 1801 stores the same information as the connecting equipment type 603 of FIG. 6. The connecting equipment ID 1802 stores the same information as the connecting equipment ID 604 of FIG. 6. The implementation date 1803 stores the same information as the implementation date 1706 of FIG. 17. The implementation time 1804 stores the same information as the implementation time 1707 of FIG. 17. The state 1805 stores information indicating the operation state of the equipment registered in the connecting equipment type 1801. For example, when the operation state of the "signal" is "blue lighting", information of "blue lighting" is stored. Note that, when a plurality of operations is to be performed in a single state so that a plurality of signals are lit in a single state in a multi-lighting type signal, the record may be separately stored. For example, with a four-bulb type signal, two yellow signals are lit in a "warning" state. Here, two records may be stored, and the state information of the first record may be "first yellow lighting", and the state information of the second record may be "second yellow lighting". Consequently, it will be possible to easily aggregate the operation of each bulb.

In this embodiment, when the corresponding railroad section timetable information 101 is input, the train dynamic simulation unit 105 refers to the running curve 106, and simulates, as the train dynamic, the train running at each location regarding all trains included in the corresponding railroad section timetable information 101. The on-rail section simulation unit 107 refers to the railroad track information 108 based on the simulation result of the train dynamic simulation unit 105, and generates on-rail section information of each train. The equipment operation history search unit 124 searches for the most similar case example from the past history in two stages based on the on-rail section information of each train. In other words, the equipment operation history search unit 124 searches for the service history, which is closest to the first service history, from the service history 125, and subsequently refers to the equipment operation history 126 from the searched service history to search for the equipment operation history.

Here, the equipment operation history search unit 124 refers to the service history 125 with the railroad section ID 1701 and the on-rail section 1708 as the search key, and searches for the information registered in the implementation date 1706 and the implementation time 1707, respectively. Here, by giving heed to the fact that a plurality of trains exist on the railroad section, information which satisfies the on-rail section information of each train and which has the same implementation date and the implementation time is searched. For example, when there is a train configured from four cars at the time of a certain evaluation, the result obtained with the on-rail section information of each train as the search key will be of the same search date and search time.

Next, the equipment operation history search unit 124 searches the operation history of the equipment by using the implementation date 1706 and the implementation time 1707. Here, the equipment operation history search unit 124 refers to the equipment operation history 126 with the implementation date 1803 and the implementation time 1804 as the search key, and acquires information registered in the connecting equipment type 1801, the connecting equipment ID 1802, and the state 1805, respectively.

The equipment operation aggregation unit 127 aggregates the information acquired by the equipment operation history search unit 124 as the operation (operating quantity) of the equipment, and outputs the aggregation result to the operation output unit 114. Note that, when the equipment operation history search unit 124 searches for a plurality of case examples, the equipment operation history search unit 124 may select one of those case examples, or statistically obtain the average value based on the distribution of the case examples.

Consequently, it is possible to estimate the operation mode of each equipment without having to simulate the track circuit or the interlocking device, and generate information that can be used for estimating the future degradation of the equipment. In the foregoing case, for the actual aggregation method and estimation method, the same processing as the track circuit-related equipment operation aggregation unit 112 of FIG. 1 can be adopted.

Note that, in this embodiment, considered may be a case where the on-rail section simulation unit 107 is not used. In the foregoing case, the service history 125 may be searched based on the dynamic (for instance, the location) of the train obtained from the train dynamic simulation unit 105. Moreover, when searching for the equipment operation history 126, information stored in the implementation date 1803 and the implementation time 1804 may be obtained with the distance (in kilometers) 1709 as the search key.

Moreover, when searching the service history 125 with the on-rail section 1708 and the distance (in kilometers) 1709 as the search key, the same equipment may be selected in consideration of the arrival/transit of the next station of the train. For example, when the target train stops at B station, the train that stops at B station may be selected from the service history 125.

According to this embodiment, it is possible to estimate the operation mode of the equipment based on the corresponding railroad section timetable information 101 and the past history without having to simulate the track circuit or the interlocking device as well as estimate the operating quantity (operation history) of the equipment, and estimate the future degradation of the equipment from the estimation result.

Fifth Embodiment

In this embodiment, the operation of the equipment is predicted upon predicting the future degradation in light of conditions that are being operated, other than train control, due to service reasons.

Figure 19:
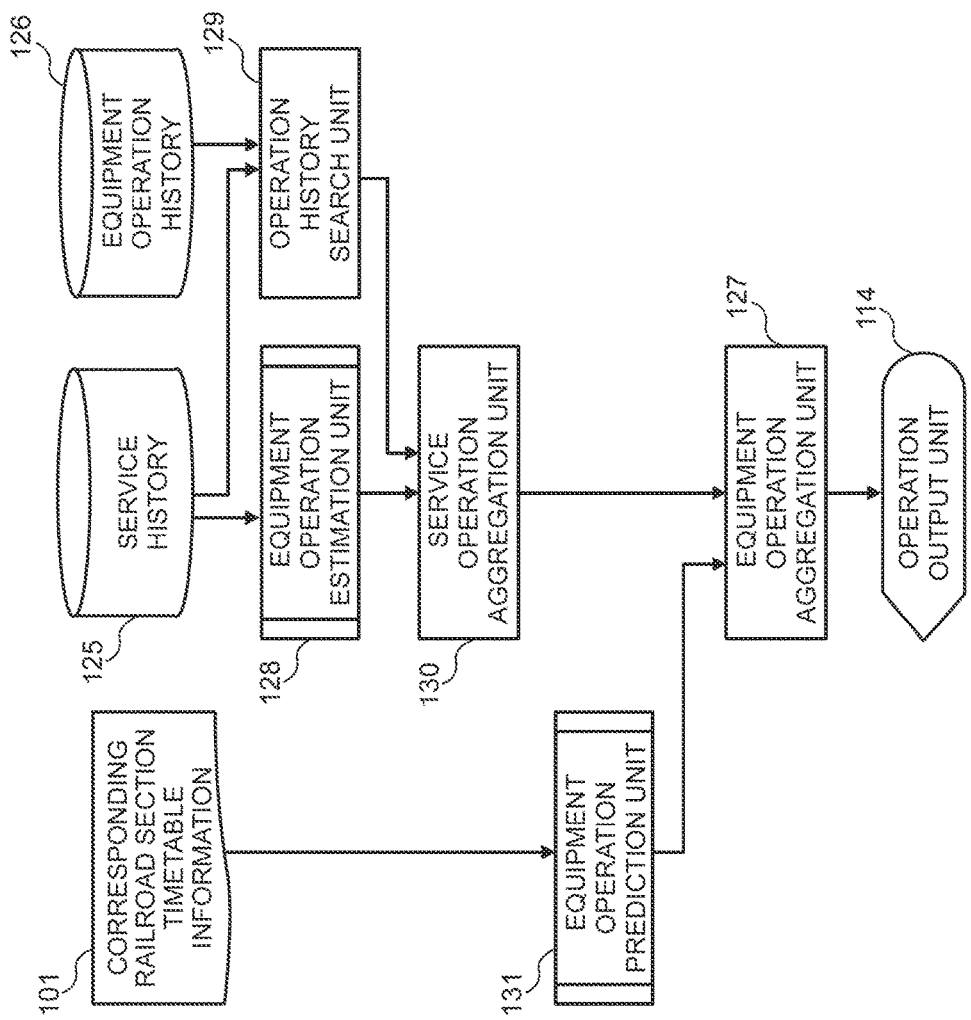
FIG. 19 is a configuration diagram showing the fifth embodiment of the degradation estimation system of railroad ground equipment according to the present invention.

FIG. 19 is a configuration diagram showing the fifth embodiment of the degradation estimation system of railroad ground equipment according to the present invention.

In FIG. 19, the degradation estimation device of railroad ground equipment in this embodiment is configured from equipment operation estimation unit 128, an operation history search unit 129, a service operation aggregation unit 130, equipment operation prediction unit 131, equipment operation aggregation unit 127, and an operation output unit 114. Note that the equipment operation estimation unit 128, the operation history search unit 129, the service operation aggregation unit 130 and the equipment operation prediction unit 131 are stored in the memory, and activated by the processor.

The equipment operation estimation unit 128 refers to the service history 125, and estimates the operation of the equipment, which is incidental to the track circuit or the interlocking device, based on the past service history. Specifically, this can be realized by executing the processing from the related timetable extraction unit 102 to the track circuit-related equipment operation aggregation unit 112 in the first embodiment, or by executing the processing from the train dynamic simulation unit 105 to the interlocking device-related equipment operation aggregation unit 119 in the second embodiment.

The operation history search unit 129 searches for the result of the equipment operation which combines the operation of the equipment based on train control (equipment to be subject to train control) and the operation of the equipment not subject to train control (equipment excluded from train control). Here, the operation history search unit 129 refers to the service history 125 and searches the service history of each train, refers to the equipment operation history 126 based on the service history of each train that was searched and searches the equipment operation history in relation to the service history of each train, and aggregates the search results.

The service operation aggregation unit 130 calculates the amount of operation of the equipment excluding train control by subtracting the estimation result of the equipment operation estimation unit 128 from the aggregation result of the operation history search unit 129. It is possible to estimate the operating quantity of the equipment excluding train control (for instance, operating quantity in the case of operating the equipment for antifreeze) from the calculation result.

Meanwhile, the equipment operation prediction unit 131 predicts the operation of the equipment from the present time toward the future based on the corresponding railroad section timetable information 101. The processing contents of the equipment operation prediction unit 131 are basically the same as the processing contents of the equipment operation estimation unit 128, but while the equipment operation estimation unit 128 estimates the past performance from the service history registered in the service history 125, the equipment operation prediction unit 131 estimates the operation of the ground equipment related to train control based on future services by using the corresponding railroad section timetable information 101.

The equipment operation aggregation unit 127 aggregates the future operating quantity of the equipment based on the operation estimate (prediction result) related to train control obtained with the equipment operation prediction unit 131 and the operation estimate excluding train control obtained with the service operation aggregation unit 130, and outputs the aggregation result to the operation output unit 114. The operation output unit 114 outputs the information aggregated with the equipment operation aggregation output unit 1806 to, for example, the display device. Here, since the operating quantity excluding train control is also output from the operation output unit 114, it is possible to estimate the degradation more accurately. In the foregoing case, for the actual aggregation method and estimation method, the same processing as the track circuit-related equipment operation aggregation unit 112 of FIG. 1 can be adopted.

FIG. 20 is a characteristic diagram showing a display example of the display device in the fifth embodiment. In FIG. 20, the screen of the display device displays, in addition to the characteristic curves 801, 802, a characteristic curve 2001 indicating the aggregation result of the operation (operating quantity) of the equipment based on train control, and a characteristic curve 2002 indicating the aggregation result of the operation (operating quantity) of the equipment based on train control+the aggregation result of the operation (operating quantity) of the equipment excluding train control. Since the characteristic curve 2001 and the characteristic curve 2002 are displayed, it is possible to comprehend the cause of the degradation of the equipment.

According to this embodiment, it is possible to predict the operation mode of the equipment based on the corresponding railroad section timetable information 101, estimate the operation (operating quantity) of the equipment based on train control and the operation (operating quantity) of the equipment excluding train control based on the service history 125 and the equipment operation history 126, aggregate the prediction result and the estimation result, and predict the operation of the equipment upon predicting the future degradation from the aggregation result.

Note that the present invention is not limited to the foregoing embodiments, and includes various modified examples. For example, the processing unit can calculate the transit time (time from the transit start time to the transit end time) that each train transits through the equipment disposed on the corresponding railroad section based on the train running information for managing a relation of the total train length of each train which runs on the corresponding railroad section and the speed of each train (information obtained by adding the total train length to the train running information 120) and the corresponding railroad section timetable information 101, and simulate, as the operation mode of the equipment, of at least either the operating frequency or the operating time of the equipment based on the calculation result. In the foregoing case, even in cases where the crossing gate remains lowered or the alarm continues to sound due to the trains passing each other, it is possible to estimate the lighting frequency of the lamp of the crossing gate or estimate the open/close frequency of the crossing gate from the simulation result of the operation mode of the equipment.

Moreover, the foregoing embodiments explained the present invention in detail to facilitate the explanation of the present invention, and the present invention is not necessarily limited to a configuration comprising all of the explained components. Moreover, it is possible to replace a part of the configuration of a certain embodiment with the configuration of another embodiment, or add the configuration of another embodiment to the configuration of a certain embodiment. Moreover, it is possible to add, delete, or replace a part of the configuration of each embodiment to, from or with another configuration.

Moreover, a part or all of the foregoing configurations, functions, processing units, and estimation units may also be realized with hardware designed with an integrated circuit. Moreover, each of the foregoing configurations and functions may also be realized with software by the processor interpreting and executing programs that realize the respective functions. Information such as programs, tables and files for realizing the respective functions may be stored in a memory or a storage device such as a hard disk or an SSD (Solid State Drive), or stored in a recording medium such as an IC (Integrated Circuit) card, an SD (Secure Digital) memory card, or a DVD (Digital Versatile Disc).

REFERENCE SIGNS LIST

101 corresponding railroad section timetable information, 102 related timetable extraction unit, 103 railroad section information, 104 peripheral railroad section timetable information, 105 train dynamic simulation unit, 106 running curve, 107 on-rail section simulation unit, 108 railroad track information, 109 track circuit simulation unit, 110 track circuit-related equipment operation simulation unit, 111 equipment information, 112 track circuit-related equipment operation aggregation unit, 113 operation acquisition information, 114 operation output unit, 115 interlocking device simulation unit, 116 wiring schematic, 117 interlocking table, 118 interlocking device-related equipment operation simulation unit, 119 interlocking device-related equipment operation aggregation unit, 120 train running information, 121 equipment impact simulation unit, 122 equipment impact information, 123 equipment impact aggregation unit, 124 equipment operation history search unit, 125 service history, 126 equipment operation history, 127 equipment operation aggregation unit, 128 equipment operation estimation unit, 129 operation history search unit, 130 service operation aggregation unit, 131 equipment operation prediction unit, 135 equipment update information, 141 station distance (in kilometers) information.

The invention claimed is:

1. A degradation estimation system of railroad ground equipment for estimating a degradation of railroad ground equipment, comprising:
    a processing unit which simulates, based on corresponding railroad section timetable information for managing a timetable of a plurality of trains running on a corresponding railroad section to be simulated, an operation mode of equipment disposed on the corresponding railroad section; and
    an estimation unit which aggregates each processing result of the processing unit and estimates a degradation of the equipment from the aggregation result,
    wherein the processing unit inputs peripheral railroad section timetable information for managing a timetable of each train which runs on a peripheral railroad section disposed on a periphery of the corresponding railroad section, and simulates, as an operation mode of the equipment, at least one of either an operating frequency or an operating time of equipment among each of the equipment that is impacted by the peripheral railroad section timetable information based on each piece of timetable information that was input and equipment information for managing a relation of equipment, which is disposed on each of the railroad sections, and each of the railroad sections, in addition to the corresponding railroad section timetable information.

2. The degradation estimation system of railroad ground equipment according to claim 1,
    wherein the processing unit simulates, as an operation mode of the equipment, at least one of either an operating frequency or an operating time of the equipment based on the corresponding railroad section timetable information.

3. The degradation estimation system of railroad ground equipment according to claim 2, further comprising:
    a display device which displays an estimation result of the estimation unit,
    wherein the display device displays, at least as an operation mode of the equipment, a transition of at least one of either an operating frequency or an operating time of the equipment along a time axis, or a transition of an operation mode of equipment to be subject to train control and a transition of an operation mode of equipment excluded from the train control among the equipment, respectively, along a time axis.

4. The degradation estimation system of railroad ground equipment according to claim 1,
    wherein the processing unit simulates, as an operation mode of the equipment, at least one of either a past operating frequency or a past operating time of the equipment by using past corresponding railroad section timetable information which indicates a past timetable of each of the trains as the corresponding railroad section timetable information.

5. The degradation estimation system of railroad ground equipment according to claim 1,
    wherein the processing unit calculates a transit time in which each of the trains passes through equipment disposed on the corresponding railroad section based on training running information, which manages a relation of a total train length of each train which runs on the corresponding railroad section and a speed of each of the trains, and the corresponding railroad section timetable information, and simulates, as an operation mode of the equipment, at least one of either an operating frequency or an operating time of the equipment based on the calculation result.

6. The degradation estimation system of railroad ground equipment according to claim 1,
    wherein the processing unit simulates a travel transition of each train existing in the corresponding railroad section timetable information as a dynamic of each of the trains based on the corresponding railroad section timetable information, simulates a state change of each of the track circuits based on the simulation result and railroad track information for managing a length of a plurality of track circuits existing in the corresponding railroad section, and simulates an operational change of equipment disposed on each of the track circuits based on the simulation result and equipment information for managing a relation of equipment, which is disposed on each of the track circuits, and each of the track circuits, and
    wherein the estimation unit aggregates simulation results indicating an operational change of equipment disposed on each of the track circuits, and estimates a degradation of the equipment disposed on each of the track circuits from the aggregation result.

7. The degradation estimation system of railroad ground equipment according to claim 6,
    wherein the train dynamic simulation unit refers to a running curve between stations existing in the corresponding railroad section upon simulating a dynamic of each of the trains.

8. The degradation estimation system of railroad ground equipment according to claim 1,
    wherein the processing unit is configured from:
    a related timetable extraction unit which extracts a related timetable related to the corresponding railroad section based on peripheral railroad section timetable information of each train which runs on a peripheral railroad section in which a part thereof is parallel to the corresponding railroad section, railroad section information for managing a relation of the corresponding railroad section and the peripheral railroad section, and the corresponding railroad section timetable information;

a train dynamic simulation unit which simulates a dynamic of each train in the corresponding railroad section based on a related timetable extracted by the related timetable extraction unit;

an on-rail section simulation unit which simulates, through association with time, on which track circuit each train running on the corresponding railroad section exists based on a simulation result of the train dynamic simulation unit and railroad track information for managing a length of a plurality of track circuits existing in the corresponding railroad section, and generates on-rail section information of each train existing in the related timetable based on the simulation result;

a track circuit simulation unit which simulates a state of a track circuit according to an on-rail condition of each train existing in the related timetable based on on-rail section information generated by the on-rail section simulation unit and the railroad track information; and a track circuit-related equipment operation simulation unit which simulates an operation of equipment related to each track circuit existing in the corresponding railroad section based on a simulation result of the track circuit simulation unit and equipment information for managing one or more equipment existing in the corresponding railroad section, wherein the estimation unit is configured from:

a track circuit-related equipment operation aggregation unit which aggregates simulation results of the track circuit-related equipment operation simulation unit according to operation acquisition information; and an operation output unit which outputs an aggregation result of the track circuit-related equipment operation aggregation unit as an operation of equipment related to each track circuit existing in the corresponding railroad section.

9. The degradation estimation system of railroad ground equipment according to claim 1, wherein the processing unit is configured from:

a train dynamic simulation unit which simulates a dynamic of each train in the corresponding railroad section based on the corresponding railroad section timetable information;

an on-rail section simulation unit which simulates, through association with time, on which track circuit each train running on the corresponding railroad section exists based on a simulation result of the train dynamic simulation unit and railroad track information for managing a length of a plurality of track circuits existing in the corresponding railroad section, and generates on-rail section information of each train existing in the related timetable based on the simulation result;

a track circuit simulation unit which simulates a state of a track circuit according to an on-rail condition of each train existing in the related timetable based on on-rail section information generated by the on-rail section simulation unit and the railroad track information;

an interlocking device simulation unit which refers to a wiring schematic which manages a connection relation of equipment to be controlled by an interlocking device and a track circuit and to an interlocking table which manages a relation of equipment to be controlled by the interlocking device and control contents of the interlocking device, and simulates an output of the interlocking device based on track number information obtained from the corresponding railroad section timetable information and a simulation result of the track circuit simulation unit; and an interlocking device-related equipment operation simulation unit which simulates an operation of equipment to be controlled by the interlocking device based on a simulation result of the interlocking device simulation unit and the equipment information, wherein the estimation unit is configured from:

an interlocking device-related equipment operation aggregation unit which aggregates simulation results of the interlocking device-related equipment operation simulation unit according to operation acquisition information; and an operation output unit which outputs an aggregation result of the interlocking device-related equipment operation aggregation unit as an operation of equipment to be controlled by the interlocking device.

10. The degradation estimation system of railroad ground equipment according to claim 1, wherein the processing unit is configured from:

a train dynamic simulation unit which simulates a train running state of each train which runs on the corresponding railroad section at each location based on the corresponding railroad section timetable information and running on the corresponding railroad section which manages a running state of each train which runs on the corresponding railroad section; and equipment impact simulation unit which simulates, based on equipment impact information for managing a relation of equipment which is impacted by a dynamic of each train which runs on the corresponding railroad section and an impact evaluation of the equipment and a simulation result of the train dynamic simulation unit, an impact of equipment which is impacted by a dynamic of each train which runs on the corresponding railroad section according to the impact evaluation, wherein the estimation unit is configured from:

equipment impact aggregation unit which aggregates simulation results of the equipment impact simulation unit; and an operation output unit which outputs an aggregation result of the equipment impact aggregation unit as an operation of equipment which is impacted by a dynamic of each train which runs on the corresponding railroad section.

11. The degradation estimation system of railroad ground equipment according to claim 1, wherein the processing unit is configured from:

a train dynamic simulation unit which simulates a dynamic of each train on the corresponding railroad section based on the corresponding railroad section timetable information;

an on-rail section simulation unit which simulates, through association with time, on which track circuit each train running on the corresponding railroad section exists based on a simulation result of the train dynamic simulation unit and railroad track information for managing a length of a plurality of track circuits existing in the corresponding railroad section, and generates on-rail section information of each train existing in the corresponding railroad section timetable information based on the simulation result; and equipment operation history search unit which searches for a service history indicating a past running state of each train recorded in the on-rail section information based on on-rail section information generated by the on-rail section simulation unit, searches, based on the search result, for equipment operation history which manages a relation of equipment disposed on a track circuit where each train exists and a past state of the equipment and is recorded in the on-rail section information, and estimates an operation of equipment disposed on the track circuit based on the search result, wherein the estimation unit is configured from:

equipment operation aggregation unit which aggregates search results of the equipment operation history search unit as an operation of equipment disposed on the track circuit; and an operation output unit which outputs an aggregation result of the equipment operation aggregation unit as an operation of equipment disposed on the track circuit.

12. The degradation estimation system of railroad ground equipment according to claim 1, wherein the processing unit is configured from:

equipment operation estimation unit which estimates an operation of equipment existing in the corresponding railroad section based on a service history indicating a past running state of each train which runs on the corresponding railroad section;

an operation history search unit which searches for equipment operation history which manages a relation of equipment disposed on the corresponding railroad section and a past state of the equipment and the service history, and extracts an operating quantity of the equipment to be subject to train control and an operating quantity of the equipment excluded from the train control among equipment disposed on the corresponding railroad section;

a service operation aggregation unit which aggregates an operating quantity of the equipment excluded from the train control based on a difference between an estimation result of the equipment operation estimation unit and an extraction result of the operation history search unit; and equipment operation prediction unit which predicts a future operating quantity of equipment which exists in the corresponding railroad section and which is to be subject to the train control based on the corresponding railroad section timetable information, wherein the estimation unit is configured from:

equipment operation aggregation unit which aggregates prediction results of the equipment operation prediction unit and aggregation results of the service operation aggregation unit, and manages the aggregation result as an operating quantity of the equipment to be subject to the train control and an operating quantity of the equipment excluded from the train control; and an operation output unit which outputs an aggregation result of the equipment operation aggregation unit as an operating quantity of the equipment to be subject to the train control and an operating quantity of the equipment excluded from the train control.

13. A degradation estimation method of railroad ground equipment for estimating a degradation of railroad ground equipment, comprising:

a processing step of simulating, based on corresponding railroad section timetable information on a timetable of a plurality of trains running on a corresponding railroad section to be simulated and further based on peripheral railroad section timetable information on a timetable of each train which runs on a peripheral railroad section disposed on a periphery of the corresponding railroad section, an operation mode of equipment disposed on the corresponding railroad section, and of processing the simulation result; and an estimation step of aggregating each processing result of the processing step and estimating a degradation of the equipment from the aggregation result.

14. The degradation estimation method of railroad ground equipment according to claim 13, wherein, in the processing step, a travel transition of each train existing in the corresponding railroad section timetable information is simulated as a dynamic of each of the trains based on the corresponding railroad section timetable information, a state change of each of the track circuits is simulated based on the simulation result and railroad track information for managing a length of a plurality of track circuits existing in the corresponding railroad section, and an operational change of equipment disposed on each of the track circuits is simulated based on the simulation result and equipment information for managing a relation of equipment, which is disposed on each of the track circuits, and each of the track circuits, and wherein, in the estimation step, simulation results indicating an operational change of equipment disposed on each of the track circuits are aggregated, and a degradation of the equipment disposed on each of the track circuits is estimated from the aggregation result.

* * * * *